United States Patent
Carmichael et al.

(10) Patent No.: US 7,036,059 B1
(45) Date of Patent: Apr. 25, 2006

(54) TECHNIQUES FOR MITIGATING, DETECTING AND CORRECTING SINGLE EVENT UPSET EFFECTS IN SYSTEMS USING SRAM-BASED FIELD PROGRAMMABLE GATE ARRAYS

(75) Inventors: Carl H. Carmichael, San Jose, CA (US); Phil Edward Brinkley, Jr., Highland Ranch, CO (US)

(73) Assignee: Xilinx, Inc., San Jose, CA (US)

( * ) Notice: Subject to any disclaimer, the term of this patent is extended or adjusted under 35 U.S.C. 154(b) by 871 days.

(21) Appl. No.: 09/783,821

(22) Filed: Feb. 14, 2001

(51) Int. Cl.
*G01R 31/28* (2006.01)

(52) U.S. Cl. ..................................... 714/725
(58) Field of Classification Search ............... 714/48, 714/725, 763, 760, 819, 797
See application file for complete search history.

(56) References Cited

U.S. PATENT DOCUMENTS

| | | | |
|---|---|---|---|
| 5,931,959 A * | 8/1999 | Kwiat ..................... | 714/48 |
| 6,104,211 A * | 8/2000 | Alfke ...................... | 326/91 |
| 6,191,614 B1 * | 2/2001 | Schultz et al. ........... | 326/41 |
| 6,237,124 B1 * | 5/2001 | Plants ..................... | 714/763 |
| 6,526,559 B1 * | 2/2003 | Schiefele et al. ........ | 716/16 |
| 6,560,743 B1 * | 5/2003 | Plants ..................... | 714/763 |
| 2001/0032318 A1 * | 10/2001 | Yip et al. ................ | 713/190 |

\* cited by examiner

Primary Examiner—Albert Decady
Assistant Examiner—Cynthia Britt
(74) Attorney, Agent, or Firm—Scott R. Brown; Edel M. Young; Justin Liu

(57) ABSTRACT

SEU mitigation, detection, and correction techniques are disclosed. The mitigation techniques include: triple redundancy of a logic path is extended the length of the FPGA to avoid weak points susceptible to SEU effects; triple logic module and feedback redundancy provides redundant hard-wired voter circuits at redundant logic outputs and voter circuits in feedback loops to ensure each logic module will receive accurate current state data even if it was upset by an SEU; enhanced triple device redundancy using three FPGAs is introduced, with a fourth device acting as a voting circuit and employing triple logic module and feedback redundancy of the second technique to provide nine instances of the user's logic and ensure complete accuracy in the system; critical redundant outputs are wire-ANDed together to ensure the output is asserted only when the redundant logic modules agree it should be asserted; redundant dual port RAMs are provided, with one port of each RAM dedicated to refreshing data and the remaining port of each RAM being available for use with the user's logic; and redundant clock delay locked loops (DLL) are provided and each DLL is monitored and reset if it does not remain in phase with the majority of the DLLs. The detection techniques include: configuration memory readback wherein a checksum for the expected value is verified; separate FPGAs perform readbacks of configuration memory of a neighbor FPGA; and an FPGA performs a self-readback of its configuration memory array. The correction techniques include reconfiguration of partial configuration data and "scrubbing" based on anticipated rather than actually detected SEUs.

13 Claims, 13 Drawing Sheets

Triple Redundancy with Voting

Virtex BUFT Structure

Voting circuit with BUFTs

Wire-ANDing Critical Outputs

Module redundancy and mitigation

Triple device redundancy

SEU Detection by Reundancy and XOR Gating

Readback CRCComparator

Redundant CRC Comparator

Instruction Set for Single Frame Write Operation

| Command | | Data (32 Bits) |
|---|---|---|
| Synchronize | | AA 99 55 66 |
| Write to CMD | | 30 00 80 01 |
| WCFG | | 00 00 00 01 |
| Write FAR | | 30 00 20 01 |
| Frame Address | | 0? ?? ?? 00 |
| Write FDRI | XQVR300 | 30 00 40 2A |
| | XQVR600 | 30 00 40 3C |
| | XQVR1000 | 30 00 40 4E |
| Frame Data | | |
| Write CMD | | 30 00 80 01 |
| RCRC | | 00 00 00 07 |

Scrubbing Control Circuit

Scrubbing State Transitions

| States | | | | Clock Cycles | | |
|---|---|---|---|---|---|---|
| Type | MOE | MCE | VCS | VWR | XQVR300 | XQVR600 | XQVR1000 |
| Load | L | L | L | L | 207,972 | 435,312 | 745,596 |
| Abort | H | H | L | H | 4 | | |
| Disable | H | H | H | H | 1 | | |

TECHNIQUES FOR MITIGATING, DETECTING AND CORRECTING SINGLE EVENT UPSET EFFECTS IN SYSTEMS USING SRAM-BASED FIELD PROGRAMMABLE GATE ARRAYS

FIELD OF THE INVENTION

The present invention relates to error avoidance and correction techniques in systems employing SRAM-based field programmable gate arrays, and, more particularly, to mitigating, detecting, and correcting radiation-induced single event upset effects on SRAM-based field programmable gate arrays.

BACKGROUND OF THE INVENTION

Field programmable gate arrays (FPGAs) are general-purpose logic devices comprising a variety of interconnectable logic resources that are configurable by the end-user to perform a wide variety of functions. Typical FPGAs comprise three types of configurable elements: configurable logic blocks (CLBs), input/output blocks, and interconnects. FPGAs that rely on static latches for their programming elements, also known as SRAM FPGAs, are reconfigurable, meaning they can be reprogrammed with the same or different configuration data; application specific integrated circuits (ASICs) and Anti-fuse FPGAs cannot be reconfigured.

Manufacturers of systems expected to be exposed to significant levels of radiation, including space-bound systems, favor the lower cost, easier and faster system development, and increased performance of commercial off-the-shelf technology such as SRAM FPGAs. In particular, SRAM FPGAs offer flexibility and fast in-circuit reconfiguration that makes them ideal for use in spacecraft and other systems requiring remote, on-the-fly reprogramming. Concerns arise, however, with the ability of technology designed for use on earth to perform reliably in a high-radiation environment. Such reliability is measured in terms of susceptibility to long-term absorption of radiation, referred to as total ionizing dose (TID), and effects caused by the interaction of a single energetic particle, referred to as single event effects (SEE).

The main sources of energetic particles contributing to SEEs in space are: trapped energetic particle radiation, including oxygen ions and protons; galactic cosmic ray protons and heavy ions, including heavy iron nuclei; and alpha particles and heavy ions and protons from solar flares. The exposure of a spacecraft's electronic systems to these hazards depends on the spacecraft's orbit or trajectory, the timing of its launch and duration in space, and the timing of system deployment and operation.

An SEE occurs when a single particle strikes a sensitive point on a susceptible device and deposits sufficient energy to cause either a hard or soft error. A soft error, or single event upset (SEU) occurs when a transient pulse or bit flip in a device causes an error detectable at the device output. SEUs may alter the logic state of any static memory element (latch, flip-flop, or RAM cell). Since the user-programmed functionality of an SRAM FPGA depends on the data stored in millions of configuration latches within the device, an SEU in the configuration memory array may have adverse effects on the expected functionality. That is, the very technology that makes SRAM FPGAs reprogrammable also makes them very susceptible to SEUs.

Techniques used for mitigating, detecting and correcting the effects of SEUs in a particular spacecraft system depend on the criticality, sensitivity, and nature of the system in question. Known mitigation techniques for use in memory and other data-related devices include parity checking and use of a Hamming, Reed-Solomon (RS), or convolutional code schemes. SEU mitigation in control-related devices is somewhat more difficult because they are, by nature, more vulnerable to SEUs and often more critical to spacecraft operation. Common control-related SEU mitigation techniques include redundant systems, watchdog timers, error detection and correction (EDAC), and current limiting. Unfortunately, many of these techniques for mitigating SEU effects in SRAM FPGAs tend to require substantial configurable logic block (CLB) resources, and can disrupt device and user function.

System redundancy involves multiple identical systems operating in lockstep with synchronized clocking. Errors, which might otherwise not be immediately noticeable, are detected when outputs disagree. Two identical systems in lockstep operation provide minimal protection, and, by way of correction, both systems must be reinitialized when an error is detected. Threefold redundancy is preferred because, based on the relatively safe assumption that any two of the three devices will always be error free, only the device whose output disagrees with the other two need be reconfigured. Thus, the system is able to continue functioning on two of the devices during the short interval needed to reconfigure the upset device.

A voting scheme makes threefold redundancy possible—a voting circuit chooses the output agreed upon by a majority of the devices and disregards the remaining device if its output disagrees with that of the majority. Such a triple modular redundancy (TMR) voting scheme has been SEU-tested for systems employing FPGAs, but requires over two-thirds of the FPGAs' gates. Unfortunately, the voting circuit, if implemented in SRAM cells, is itself susceptible to SEU effects. Furthermore, applying TMR techniques to internal flip-flops alone is insufficient by itself because it may very well be the circuit that precedes the flip-flops that fails, thereby causing all three redundant flip-flops to load the same incorrect value.

Design mitigation techniques, such as triple redundancy, can harden functionality against single event upsets. However, mitigation techniques alone do not correct the erroneous results of SEUs and such errors can accumulate over time. Error detection techniques include reading back the entire configuration data memory and performing a bit-for-bit comparison against data known to be correct. Error correction techniques include complete reconfiguration of the entire configuration data memory using data known to be correct. Both techniques are inefficient, can require additional hardware, can require substantial configurable logic block (CLB) resources, and can disrupt device and user function.

Consequently, new mitigation, detection, and correction techniques to combat the effects of SEUs on SRAM FPGAs in space applications are desirable.

SUMMARY OF THE INVENTION

The SEU mitigation, detection, and correction techniques of the present invention provide essential enabling technology which makes the operation of SRAM FPGAs in high radiation environments practical and efficient by avoiding or correcting, as required, the effects of SEUs on the devices.

More particularly, the techniques of the present invention reliably mitigate, detect, and correct upsets in the SRAM cells (the configuration memory) without disrupting device and user functions and make efficient use of any CLB resources used.

In a first mitigation technique, triple redundancy of the logic path is extended the length of the FPGA to avoid weak points susceptible to SEU effects. In a second mitigation technique, triple logic module and feedback redundancy provides redundant voter circuits at redundant logic outputs and voter circuits in feedback loops to ensure each logic module will receive accurate current state data even if it was upset by an SEU. In a third mitigation technique, enhanced triple device redundancy using three FPGAs is introduced, with a fourth device acting as a voting circuit and employing triple logic module and feedback redundancy of the second technique to provide nine instances of the user's logic and ensure complete accuracy in the system. Unlike triple logic design redundancy in a single device (as in the first technique, above), this last technique protects against the failure of an entire chip. In a fourth mitigation technique, critical redundant outputs are wire-ANDed together to ensure the output is asserted only when the redundant logic modules agree it should be asserted. In a fifth mitigation technique redundant dual port RAMs are provided, with one port of each RAM dedicated to refreshing data and the remaining port of each RAM being available for use with the user's logic. In a sixth mitigation technique, redundant clock delay locked loops (DLL) are provided and each DLL is monitored and reset if it does not remain in phase with the majority of the DLLs.

In a first SEU detection technique, a traditional configuration memory readback technique is implemented in a novel way wherein a checksum for the expected value is verified rather than a bit by bit comparison of the configuration memory array to the configuration file. By using a checksum, inefficient bit-for-bit comparison is avoided in favor of detecting upsets at the data frame (multi-bit) level. In a second SEU detection technique, separate FPGAs perform readbacks of configuration memory of a neighbor FPGA. In a third detection technique, an FPGA performs a self-readback of its configuration memory array.

The present invention also provides two SEU correction techniques. In a first technique, reconfiguration is performed only on data frame(s) identified as containing an upset bit, rather than reconfiguring the entire design. In a second technique, total reconfiguration, or "scrubbing", is performed based on anticipated rather than actually detected SEUs.

These and other advantages of the present invention are further described in the detailed description of the drawings, below.

BRIEF DESCRIPTION OF THE DRAWINGS

A preferred embodiment of the present invention is described in detail below with reference to the attached drawing figures, wherein.

DETAILED DESCRIPTION OF THE DRAWINGS

Figures 1, 2:
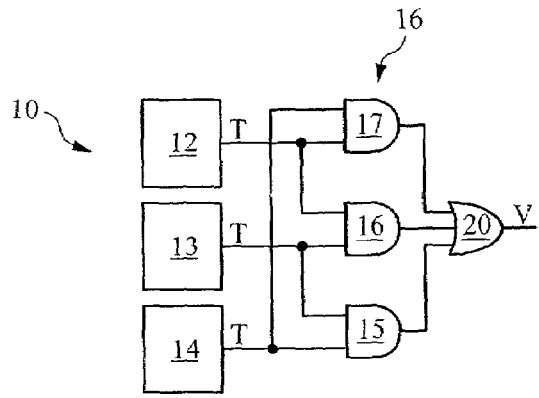
FIG. 1 is a typical majority voting circuit associated with triple redundant logic paths.
FIG. 2 is a truth table of all possible inputs and corresponding outputs of the typical majority voting circuit shown in FIG. 1.

The present invention includes SEU mitigation, detection, and correction techniques for SRAM FPGAs operating in high radiation environments. Preferred embodiments of the techniques are described below in terms of a preferred FPGA architecture, currently available in the Virtex series of FPGAs from Xilinx. A brief description of the preferred, commonly available FPGA architecture is provided below for clarity. Some of the techniques may also be employed using an alternative FPGA architecture, a description of which is also provided below.

The Preferred FPGA Architecture

The preferred FPGA, sold under the name Virtex® by Xilinx, Inc., comprises three major configurable elements: configurable logic blocks (CLBs), providing functional elements for constructing logic; input/output logic blocks (IOBs), providing an interface between the package pins and the CLBs; and a general routing matrix (GRM) comprising an array of routing switches located at the intersections of horizontal and vertical routing channels for routing signals between CLBs and CLBs and IOBs. Local routing resources are provided to connect the CLB to the GRM.

The preferred FPGA architecture also includes dedicated block memories (BRAMs) of 4096 bits each; clock delay-locked loops (DLLs) for clock-distribution delay compensation and clock domain control; and TBUFs associated with each CLB and operable to drive dedicated segmented horizontal routing resources.

Each CLB is comprised of a plurality of logic cells (LCs). Each LC includes a four-input function generator, carry logic, and a storage element. Function generators are implemented as four-input look-up tables (LUTs). Each CLB also contains logic operable to combine function generators and thereby may appear to contain more LCs than are actually present. Each LUT is also operable to provide a 16×1 bit synchronous RAM or 16 bit shift register. Furthermore, multiple LUTs can be combined to form a 16×2 bit or 32×1 bit synchronous RAM, or 16×1 bit dual-port synchronous RAM.

The CLB also comprises a plurality of tri-state buffers (TBUFs) operable to drive on-chip busses. Each TBUF has an independent tri-state control pin and an independent input pin, both being selectably invertable.

The output of the buffers may be connected to one of four horizontal bus channels depending on the configuration of the connection resources of the GRM. In each CLB column, one of the four channels may be selected to terminate or continue to another segment. This bus architecture allows for multiple bus structures of varied sizes to be implemented in the same CLB row.

In the preferred FPGA, values stored in SRAM cells, comprised of cross-coupled inverters (static latches), control the configurable logic elements and interconnect resources. These values load into the memory cells on power-up, and can be reloaded if necessary to reinstate the original function. The values can also be changed, by reprogramming or "reconfiguring" the configurable memory, to implement a different function.

The configuration memory cells lie close to the specific functions they control and are laid out in a regular pattern. A "data frame" is defined as a 1-bit slice of the memory array along the vertical axis. The configuration data is written to the configuration memory from configuration registers one data frame at a time. Therefore, one data frame is the smallest portion of configuration data that may be read from or written to the configuration memory.

A single data frame contains portions of configuration data for each and every block that lies in that column. Hence, multiple data frames are required to describe the complete width of a column. In order to read and write individual data frames, each must be uniquely addressed by the configuration logic. For this reason, each column is identified by a "major address" and each frame in that column is identified by a "minor address".

The preferred FPGA provides multiple access ports for the purpose of writing and reading data to/from the configuration memory array. One such access port, hereafter referred to as the "SelectMAP" port, is an 8-bit parallel bi-directional synchronous interface to the configuration control logic. All configuration control logic registers and configuration memory can be addressed and manipulated through the SelectMAP port. In particular, the SelectMAP port may be used to address small portions of the configuration memory map for read (SEU detection) and write (SEU correction) operations.

Alternative FPGA Architecture

Some of the techniques described below may also be implemented on an alternative FPGA architecture, for example, the Xilinx XC4000 device. The XC4000 architecture has many of the same features described above, including CLBs, IOBs, and a GRM. The CLBs, IOBs, and GRM are implemented similarly but not identically to the preferred architecture.

Each CLB is comprised of a plurality of logic cells (LCs). Each LC includes a four-input function generator, carry logic, and a storage element. Function generators are implemented as four-input look-up tables (LUTs). Each CLB also contains logic operable to combine function generators and thereby may appear to contain more LCs than are actually present.

The IOBs consist of input/output logic blocks, providing an interface between the package pins and the CLBs depending on how the associated SRAM cells, also comprised of cross-coupled inverters, are set to control their configuration.

Values stored in SRAM cells control the configurable logic elements and interconnect resources of the GRM. These values load into the memory cells on power-up, and can be reloaded if necessary to reinstate the original function. The values can also be changed, by reconfiguring the configurable memory, to implement a different function.

The alternative architecture does not implement BRAMs, and does not have the ability to write to the configuration memory without disturbing the functioning of the device. Nor does the alternative architecture have the ability to partially reconfigure by writing to individual memory frames of the configuration memory array. Finally, the alternative architecture does not implement TBUFs in the same way as described below with reference to FIG. 3 for the preferred architecture. Thus, it is not possible to implement the hardwired majority voting circuit described below in the alternative architecture.

SEU Mitigation Techniques

Hardwired TMR Voting Circuit

TMR is a well-known SEU mitigation technique employing three identical logic circuits to perform the same task in tandem and then, using a majority voting circuit, to compare corresponding outputs. An output agreed upon by at least two (a majority) of the three identical circuits is considered correct.

A typical majority voting circuit 10 is shown in FIG. 1, wherein three flip-flops 12, 13, 14 operating in parallel feed a gating circuit 16 comprising three interconnected AND gates 17, 18, 19 and an OR gate 20. The output of the gating circuit 16 reflects the state of the majority of the flip-flops 12, 13, 14. FIG. 2 is a truth table showing the relationship between the flip-flop outputs and the resulting "vote", or majority voting circuit output.

Inherent in this technique is the assumption that only one SEU occurs within a given time period (i.e., the time required for the next clock edge to occur and load the flip-flops 12, 13, 14 with new data). If two of the flip-flops 12, 13, 14 suffer contemporaneous upsets, the majority voting circuit 10 will select the state of the two incorrectly set flip-flops 12, 13, 14.

Most SRAM-based logic devices cannot reliably implement TMR-based SEU mitigation schemes because the majority voting circuit 10, like any other boolean function, must be implemented in SRAM cells, thereby making it equally susceptible to upsets. Absent employing one or more of the mitigation, detection, and correction schemes discussed in this application, it would be disadvantageous to implement the voting circuit in a standard logic function generator, such as a LUT, configured by setting static latches.

Figure 3:
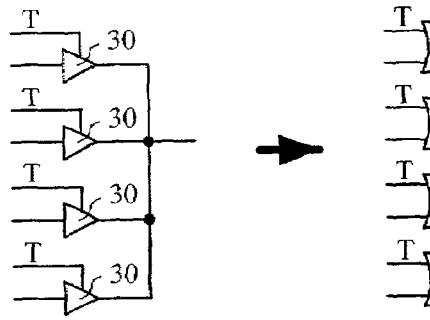
FIG. 3 is a logic-based description of the buffer structure of a preferred FPGA architecture upon which a preferred SEU mitigation technique of the present invention, involving hardwired voting circuits, relies.
Figures 4, 5:
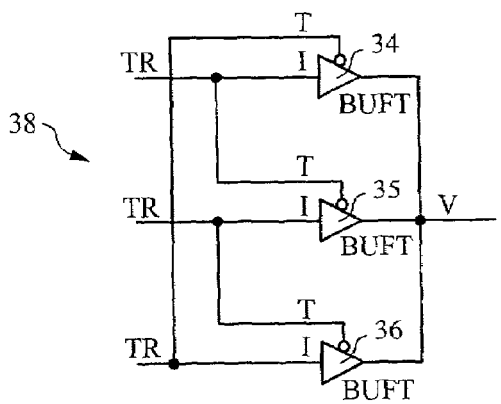
FIG. 4 is a voting circuit implemented using the hardwired buffers of a preferred FPGA architecture and illustrating a preferred SEU mitigation embodiment of a technique of the present invention, the voting circuit having the same functionality as the typical majority voting circuit shown in FIG. 1.
FIG. 5 is a truth table of all possible inputs and corresponding outputs of the voting circuit shown in FIG. 4.

The architecture of the preferred FPGA, however, provides a solution to implementing the majority voting circuit 10 reliably. Referring to FIG. 3, the left hand side of that figure shows a logical abstraction of functionality provided by the preferred FPGA. The right hand side of FIG. 3 shows that in reality, to obtain the functionality depicted in the drawing of the tri-state buffers (TBUFs) 30 on the left hand side, the preferred architecture actually implements this functionality, after the interconnects between the structures have been appropriately selected, using the hardwired AND-OR logic structure 32 shown on the right hand side of the figure rather than the pass transistors typically used in other architectures. Because of this hardware implementation shown on the right hand side of FIG. 3, as shown in FIG. 4, the TBUF elements 34, 35, 36 can be cross-connected to produce the same boolean function (truth table shown in FIG. 5) as is used for the majority voting circuit of FIG. 1 (compare FIGS. 2 and 5). The result is a voting circuit 38 whose functional description is not based on the contents of any SEU-susceptible SRAM cells.

The only aspects of this circuit 38 controlled by configuration memory cells are the routing "pips", or selectively connectable intersection points, which connect the AND-OR logic structure together. Upsetting one of these cells would only result in temporarily disconnecting one of the inputs or outputs of one of the TBUFs 34, 35, 36. Such an upset would not effect the output of the voting circuit 38 because a majority of the TBUFs would still function correctly. Thus, this technique is completely impervious to a single upset failure; only multiple simultaneous upsets occurring in very specific patterns would cause it to fail.

Even in a radiation hardened ASIC, a TMR-based mitigation scheme is only reliable when no more than one of the three signal nodes to be evaluated is upset. If two or more of the redundant modules are presenting an incorrect result due to multiple upsets, then a properly functioning voting circuit would favor the incorrect data. The probability of this happening in an ASIC is in fact far greater than the probability of the patterned multiple simultaneous upsets required to cause the preferred technique of the present invention to fail.

A further increase in overall reliability may be achieved through mitigation of the results either presented to, or obtained from, any particular mitigated node. This will be discussed in more detail below.

There are advantages to implementing the voting circuit using the programmable logic generators available in the preferred and alternative FPGA architectures. Given the truth table of FIG. 2, such an implementation is straightforward to one of ordinary skill in the art. Using a LUT for this function would be advantageous when, for example, designs that are not limited by available logic resources found within a particular device require the fastest possible timing performance. Building majority voters in the LUT's may provide a faster circuit implementation. The LUT's are generally used to implement all combinatorial logic in the user's design. Therefore, using LUT's to implement the voters allows the voter logic to be dissolved into general combinatorial logic with less propagation delay. By decreasing propagation delay, timing performance is improved.

Full Length Triple Redundancy

TMR provides SEU mitigation only so long as triple redundancy is maintained. A logic path made triple redundant must at some point become a single path again. If this occurs within the FPGA, then a single point of potential failure arises.

Figure 6:
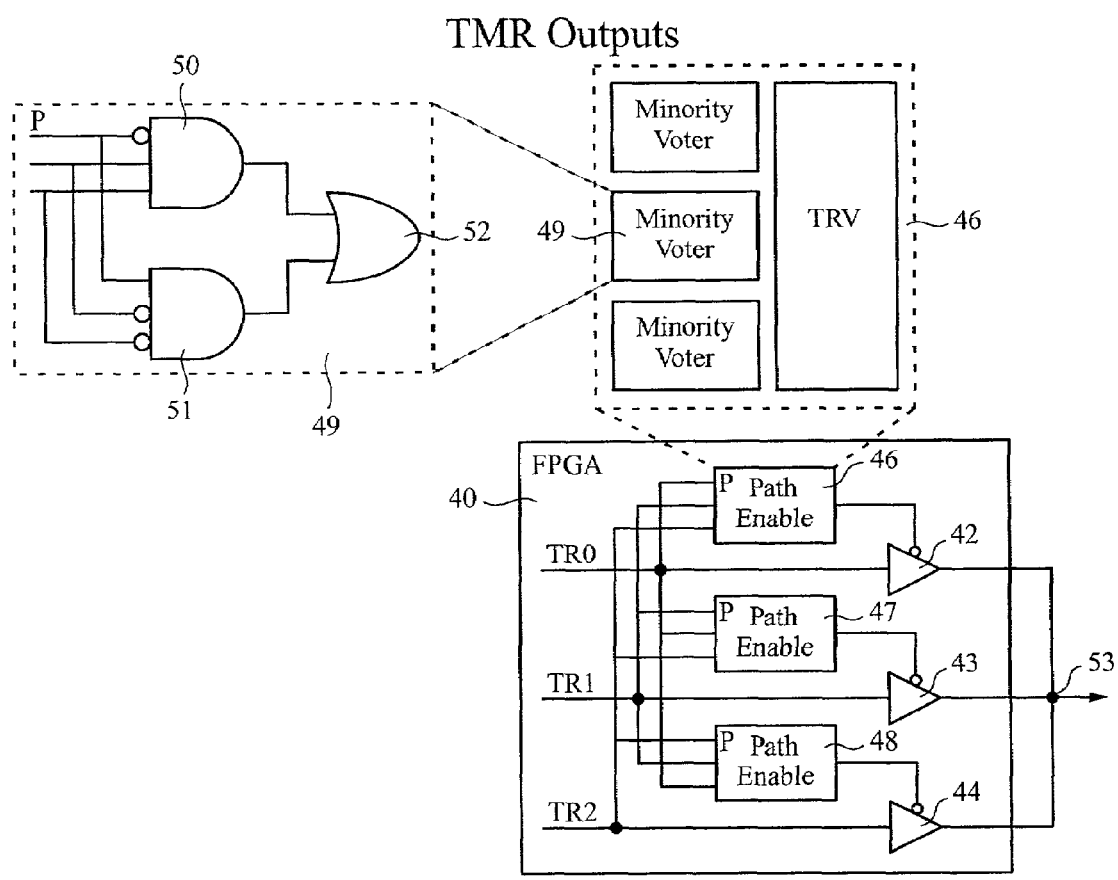
FIG. 6 is a block diagram illustrating in detail the output portion of a preferred SEU mitigation technique of the present invention involving full-length triple redundancy.

The preferred technique uses triple redundant voters and triple redundant I/Os to maintain the protection of triple redundancy until the redundant logic paths leave the chip. Referring to FIG. 6, each logic path exits the chip 40 through a tri-state output buffer (TOBUF) 42, 43, 44. The enable control 46, 47, 48 of each TOBUF 42, 43, 44 is controlled by a minority (not a majority) voting circuit 49 which determines whether the associated logic path is part of the majority or not. That is, if the logic path associated with the path enable control logic 46 and input to the enable control logic 46 disagrees with the majority, then the logic 46 outputs a "1" which is subsequently inverted at the buffer 42 to disable the output. If, however, the path agrees with the majority then it is allowed to drive off-chip. One logic implementation of the minority voter 49 is shown in FIG. 6. The minority voter comprises two AND gates 50, 51 whose outputs connect to an OR gate 52. The input from the logic path associated with the particular minority voter is denoted by a P and is the topmost input to the AND gates 50, 51. The remaining two inputs to the AND gates come from the other two redundant logic paths. As will be appreciated by one of ordinary skill in the art, the OR gate 52 will output a logic high only if the input P is a minority signal when compared to the remaining two signals. In this way, each output buffer is only enabled if the signal presented to its input is a majority signal.

Outside the FPGA 400, the three redundant TOBUFs 42, 43, 44 are simply wired together 53. If one of the three redundant paths doesn't agree with the other two, its output is shut off and the other two will continue to drive. This technique is referred to as wired-parallel. Another device connected to the resulting single lead will see only a single signal that is always correct.

Triple Module and Feedback Redundancy

Figure 8:
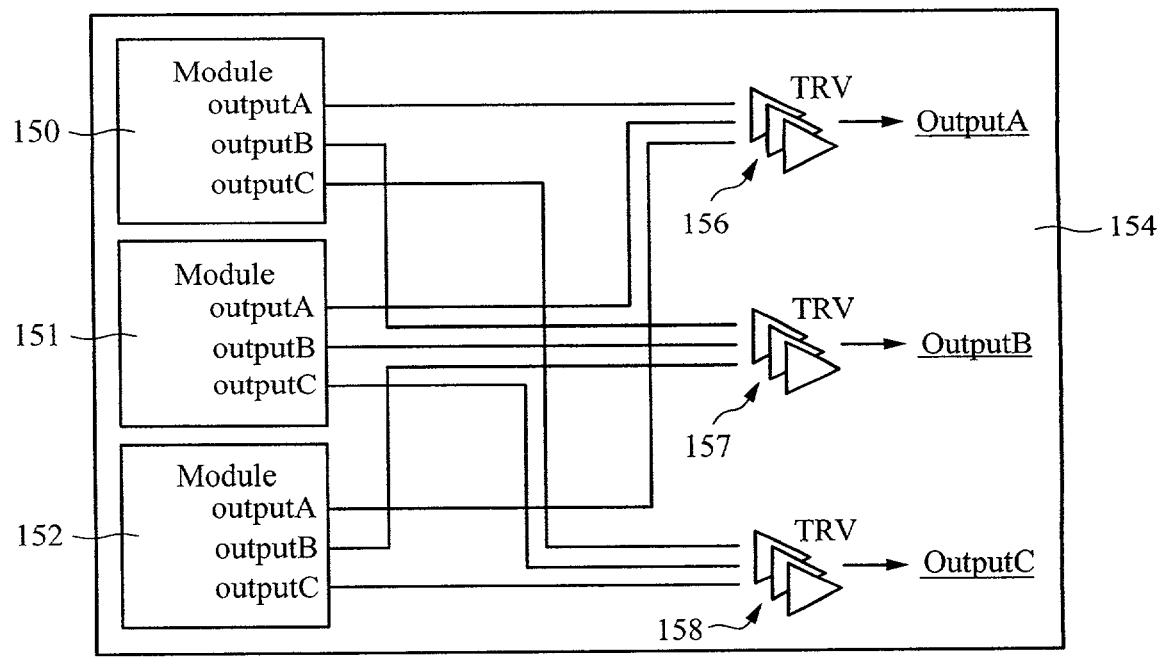
FIG. 8 is a block diagram of a preferred SEU mitigation technique of the present invention involving single-chip triple redundancy.

Referring to FIG. 8, an SEU mitigation technique is shown wherein three identical instances of a logic module 150, 151, 152 are configured in a single device 154, and the final outputs of the redundant instances 150, 151, 152 are triple mitigated using, for example, triple redundant voting circuits 156, 157, 158. An advantage of this technique is that it will not affect system performance. This is because the voting circuits are internal to the FPGA, the outputs are not delayed, and the voting circuits are all in parallel in the output data path. The logic module may represent either an entire logic design or a portion of that design, depending on how much of the design and redundant instances thereof will fit on a single device.

Figure 9:
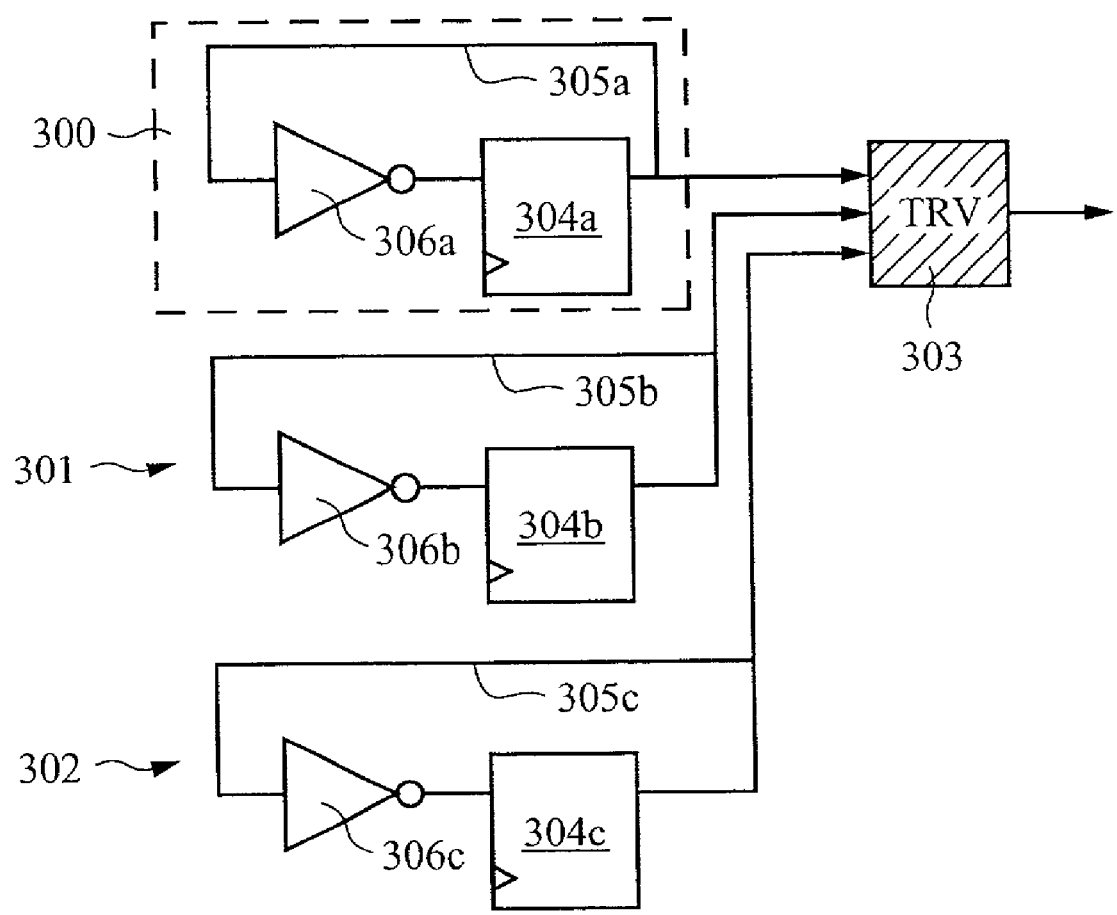
FIG. 9 shows triple redundancy of a simple state machine feeding to a majority voting circuit.

FIG. 9 shows an example of a simple state machine 300 and two redundant instances of the same machine 301, 302, providing triple redundant logic, with the output of each state machine being fed to a voting circuit 303. The state machine 300 is a one-bit counter implemented using a flip-flop 304a with a feedback path 305a and an inverter 306a in the feedback path. The flip-flop 304a is started in a known state, and then with each clock cycle that state is inverted. The logic is made redundant, and the majority voting circuit 303 outputs the value agreed upon by two or more of the redundant state machines 300–302. If one of the flip-flops 304a–304c is upset by an SEU, the remaining two flip-flops continue to output the correct value, which is passed out of the circuit by the majority circuit. The disadvantage of this approach is that the upset flip-flop will never be corrected, and should a second SEU upset one of the other flip-flops of the redundant logic, the majority voter circuit 303 will output an incorrect result. There is no mechanism for this system to recover from an upset in more than one instance of the logic.

Figure 10:
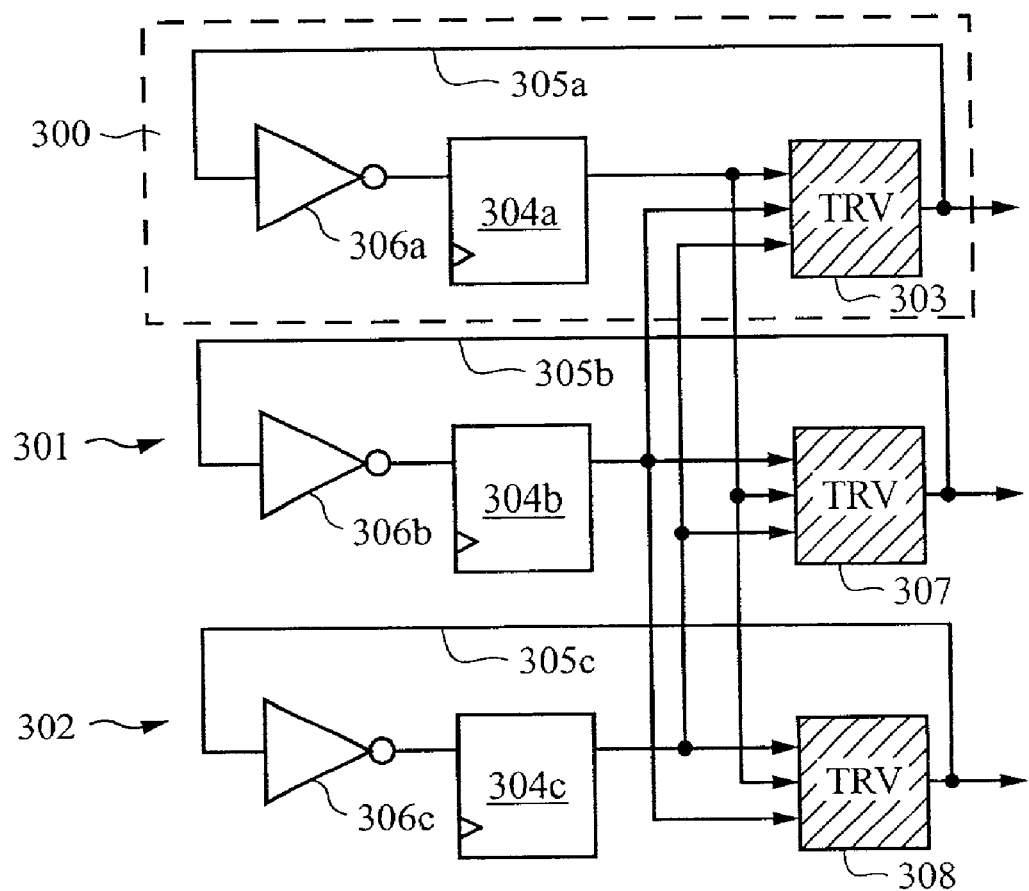
FIG. 10 shows the triple redundancy state machine of FIG. 9 with redundant majority voters in the feedback loop of each state machine according to one technique of the present invention.

A better approach is shown in FIG. 10. In this implementation, two additional majority voting circuits 307, 308 have been added to the redundant system of FIG. 9. This ensures that an upset in a single voting circuit will not result in bad data being passed on. Moreover, the voter circuits have been added into the feedback paths 305a–305c as well. For example, the output of voter 303 is fed back to the input of inverter 306a. A similar connection exists for each redundant instance of the logic and the voter associated with that logic. Thus, if one of the flip-flops 304a–304c is upset by an SEU, it will still receive the correct current state as determined by its associated voting circuit 303, 307, 308. If flip-flop 304a is upset and holds a logic 1 when it should hold a logic 0, the output from voter circuit 303 will still be a logic 0. Because the output of the voter 303 is fed back, the input to flip-flop 304a will be logic 0 during the next clock cycle as if flip-flop 304a held the correct value. Consequently, the upset flip-flop 304a will return to the proper state on the next clock cycle.

By including a voting circuit that receives the output of the redundant state machines in the feedback path of a state machine, an upset state machine will receive the correct current state within one clock cycle. The outputs from redundant instances of the logic will provide the correct current state and the upset state machine will fully recover as soon as the current state information resets the state machine to the correct output. While a simple state machine is demonstrated for illustrative purposes in this example, the exact same principles apply regardless of the complexity of the state machine involved.

Enhanced Triple Device Redundancy

Figure 11:
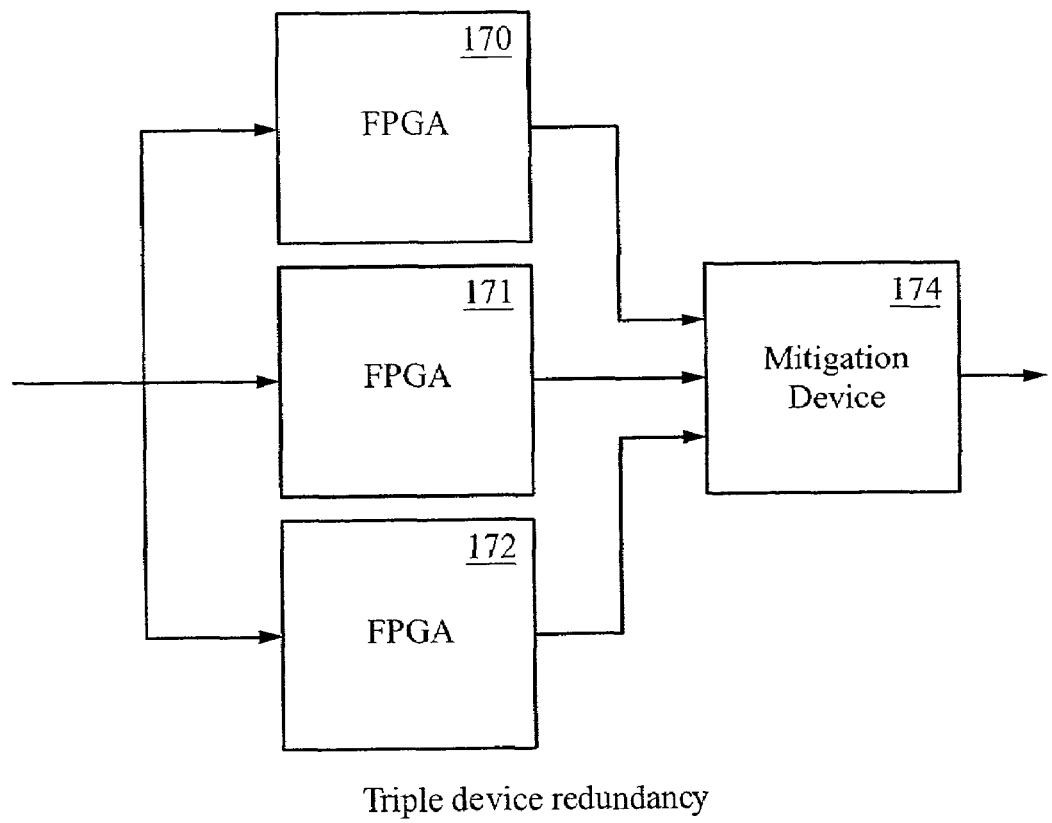
FIG. 11 is a block diagram illustrating a preferred SEU mitigation technique of the present invention involving triple-redundant devices with mitigated outputs.

Triple device redundancy, shown in FIG. 11, is the most reliable mitigation technique, having the highest reliability for filtering single and multiple event upsets, multiple transient upsets, and any other functional interrupts including total device failure. It is, however, also the most costly solution and provides only a marginal actual improvement over alternative methodologies.

In this technique, a complete design is replicated in three redundant FPGAs 170, 171, 172. In some instances, if an upset is detected in one of the devices 170, 171, 172 that device may be taken offline if certain criteria established by the user are met. The device is then repaired while another device is selected from the redundancy queue to continue processing. Mitigation using redundant devices requires a fourth device 174 (possibly more, depending on I/O count) which can be, for example, another programmable logic device with internal redundancies, or a small rad-hard ASIC. Alternatively, a processor could be used to manage the redundant devices as a queue.

Enhanced triple device redundancy may be achieved by combining the triple module redundancy and feedback technique described above with the known triple device redundancy technique. In such a system, each FPGA contains three instances of the required logic. Additionally, redundant voters are provided as described in FIG. 10, and the voter outputs are in the feedback paths of each logic instance. Thus, there will be nine instances of the required logic, with redundant voters ensuring that the correct value is fed back to the redundant logic instances and output to the system.

Logic Duplication and Dual Device Voting

Where a complete design is less than one-half but greater than one-third of an FPGA's size, an alternative to single-chip triple redundancy is dual device logic duplication. If logic is duplicated and like outputs compared on a first device, then whenever the outputs differ an SEU or SEFI has been detected. If an upset has been detected, the device will be prevented from outputting its result.

Figure 12:
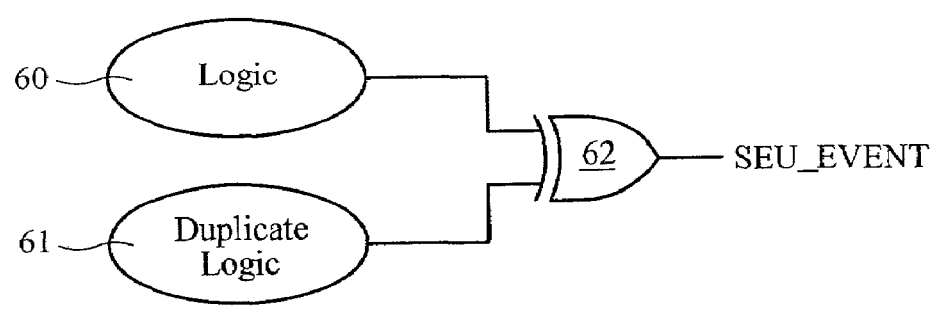
FIG. 12 is a circuit illustrating a preferred SEU mitigation technique of the present invention, involving logic redundancy, in which the outputs of duplicate copies of a logic design are XORed together to detect SEUs.

A preferred technique for detecting SEUs is shown in FIG. 12, wherein duplicate logic functions 60, 61 are run in tandem and their outputs fed to an XOR gate 62. If the outputs of the logic functions 60, 61 disagree, then the XOR gate 62 will output a "1", indicating that an SEU has occurred. In larger systems, the outputs of multiple XOR gates can be ORed to produce a single SEU indicator.

Figure 13:
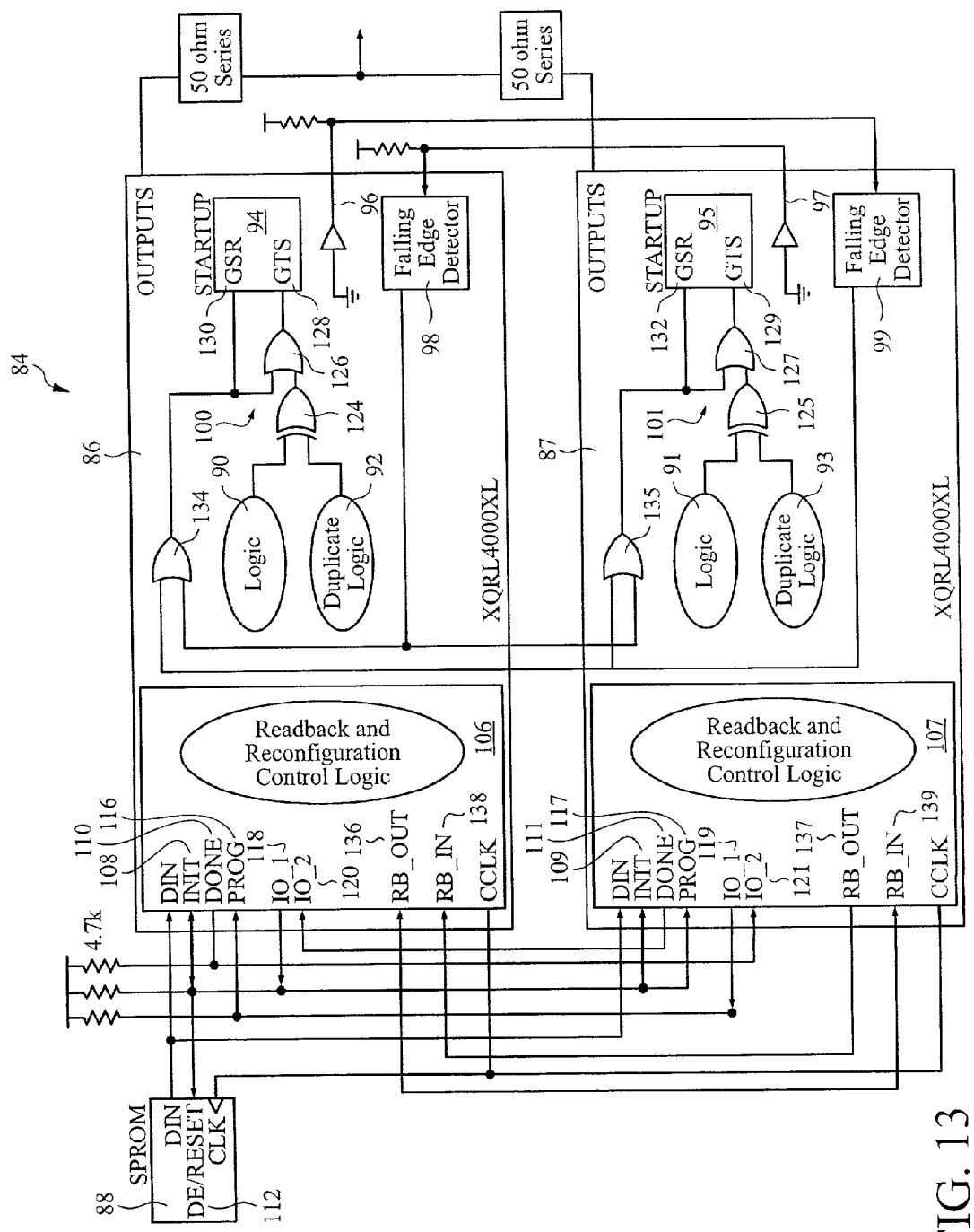
FIG. 13 is an alternative embodiment illustrating a preferred SEU mitigation technique of the present invention involving dual device redundancy and neighbor readback of configuration memory.

FIG. 13 illustrates a way of using the dual device dual logic technique in an alternative architecture. A dual voting system 84, based on duplicate logic functions, incorporates into two FPGAs 86, 87 and a storage PROM 88 a fully redundant, self-mitigating system with built-in SEU detection and correction. The system 84 further comprises the user's basic design (logic) 90, 91; duplicates of the basic design (duplicate logic) 92, 93; a STARTUP component (primitive) 94, 95; a constant Low output 96, 97; a falling edge detector 98, 99, support logic 100, 101; and a state machine 106, 107 to control readback of configuration memory and auto-configuration of the neighboring FPGA 86, 87. Readback of a neighbor FPGA configuration memory on the alternative architecture will be discussed in more detail below when discussing detection techniques.

The two FPGAs 86, 87 configure sequentially and then synchronize. Both FPGAs 86, 87 should be set for MasterSerial Mode configuration (all mode pins tied Low M[2: 0]<000>). Upon power-up, both FPGAs 86, 87 will drive their INIT pins 108, 109 Low until they are ready for configuration. Because they are in Master Mode, the FPGAs 86, 87 will release their INIT pins 108, 109 and commence clocking the configuration data out of the serial PROM 88 once their INIT pins 108, 109 have externally transitioned High. This process can be delayed by holding INIT 108, 109 Low externally.

The top FPGA 86 will commence configuration first. The DONE pin 110, 111 of each FPGA 86, 87 is driven Low by each device until configuration is complete. Since the DONE pin 110 of the top FPGA 86 is connected to the INIT pin 109 of the bottom FPGA 87, the bottom FPGA 87 cannot commence configuration until the top FPGA 86 has released its DONE pin 110 upon completion of its own configuration.

When the top FPGA 86 has completed configuration and has released its DONE pin 110, the bottom FPGA 87 will attempt to commence configuration. However, in order for the bottom FPGA 87 to successfully configure, both the PROM 88 and the bottom FPGA 87 must be reset by pulsing Low OE/RESET 112 and PROG 117, respectively. This is accomplished with the IO_1 pin 119.

The IO_1 pin 118, 119 is user-defined and may, if the user so chooses, co-exist on the same pin 108, 109 as INIT. IO_1 pin 118, 119 is a dual-function pin that becomes a user-programmable I/O (IOB) after configuration is complete. The IO_2 pin 120, 121 is also a user-defined I/O; in some FPGAs it must be on a standard programmable I/O pin.

Once configured and activated, the top FPGA 86 should sense that the DONE pin 111 of the bottom device 87 is Low on its IO_2 input pin 120, and subsequently pulse its IO_1 pin 118 Low for at least 300 ns. This will reset the serial PROM 88 and force the bottom FPGA 87 into reconfiguration.

When the bottom FPGA 87 has completed its configuration, the top FPGA's DONE pin 110 should be observed High on the IO_2 input pin 121, and normal system operation will begin. When an FPGA 86, 87 is configuring, all its outputs are in a high-impedance state. Therefore, the constant Low output 96, 97, shown as an output buffer (OBUF) tied Low, will pull High indicating that the FPGA 86, 87 is off-line. When the FPGA 86, 87 is done configuring, the constant Low output 96, 97 will return Low.

In operation, the logic design 90, 91 is configured and duplicated 92, 93 in each FPGA 86, 87. Corresponding logic output pairs feed an XOR gate 124, 125, the output of which is sent to an OR gate 126, 127 which, in turn, drives the global tri-state (GTS) pin 128, 129 of the STARTUP component 94, 95. Global set/reset (GSR) 130, 132 is included in case the OR gate 134, 135 driving the GSR 130, 131 is upset.

The GTS 128, 129 and GSR 130, 131 of the STARTUP components 94, 95 are all entirely asynchronous and hard-wired and therefore do not depend on any storage elements or clock sources. The GTS signal 128, 129, when asserted, will tri-state all FPGA outputs, which prevents incorrect data from propagating out into the system.

If the occurrence of an SEU affects the function of the user logic, the compare circuitry will assert the GTS signal 128, 129 for that device 86, 87. Asserting GTS 128, 129 causes all the I/O pins of the affected FPGA 86 or 87 to take a high-impedance state; however, the unaffected FPGA 86 or 87 will continue to drive the correct data. If the SEU is merely transient (i.e., no configuration cells are upset), GTS 128 or 129 will release when the redundant logic modules 90, 92 or 93, 94 are resynchronized. For complex designs, an additional security measure may be added to time-out when one device 86 or 87 has been off-line too long, and issue a soft reset to both FPGAs 86, 87 to resynchronize the system 84.

It is possible for an SEU to affect the functional operation of the design (i.e., to upset the stored value in a CLB flip-flop) without upsetting any configuration memory latches. Such an upset would not be detected by a readback and comparison of the configuration data, and thus would not induce a reconfiguration. When a functional upset like this occurs, there will most likely be a discrepancy between the "Logic" 90, 91 and the "Duplicate Logic" 92, 93 which will result in the FPGA outputs having a high-impedance state. Whether or not the FPGAs' design will eventually resynchronize without a reset depends entirely on the complexity of the design itself.

A pipelined arithmetic through-put function, such as a multiplier, will always resynchronize within the number of clock stages present between the upset flip-flop and the output. However, a highly complex state machine may never recover. If the possibility of a functionally upset design never recovering is of concern, then the designer should include a watch-dog timer to reset the system. The timer is preferably a counter that is clock-enabled by the constant Low output of the neighbor FPGA 86 or 87. When the neighbor FPGA 86 or 87 tri-states its pins, the Low output will pull high and cause the timer to start incrementing. When the timer has reached a terminal count value, it should pulse the GSR 130, 131 of both FPGAs 86, 87. The length of the terminal count is application specific.

The benefit of the above described logic duplication and dual device voting SEU mitigation technique is that the system 84 will continue to function using one FPGA 86 or 87 while the other is either upset or being reconfigured. However, the basic user's logic must be designed to tolerate unexpected global resets. Resistance may be added to each FPGAs' output for impedance matching purposes and absorption of transients.

Another advantage of this technique is the quadruple pin redundancy resulting from both logic duplication and device redundancy, making it reliable for even the most critical functions and applications. Also, in the absence of upsets, both output drivers are active, which effectively doubles the drive strength on that trace.

Wire-ANDing

Wire-ANDing can be used to drive the combined outputs of a redundant circuit to the active state only when a majority of the redundant logic paths agree. Wire-ANDing redundant logic outputs can be used to mitigate the effects of SEUs in critical systems that cannot tolerate an erroneous logic state for any period of time, including the time required to perform a readback, detect an SEU, and correct the situation. Wire-ANDing does not ensure that a desired signal will be correctly asserted in spite of an SEU, it merely assures that a signal will not be erroneously asserted due to an SEU. Thus, Wire-ANDing may be used as a fail safe method to ensure that a catastrophic signal will not be asserted due to an SEU.

Figure 7:
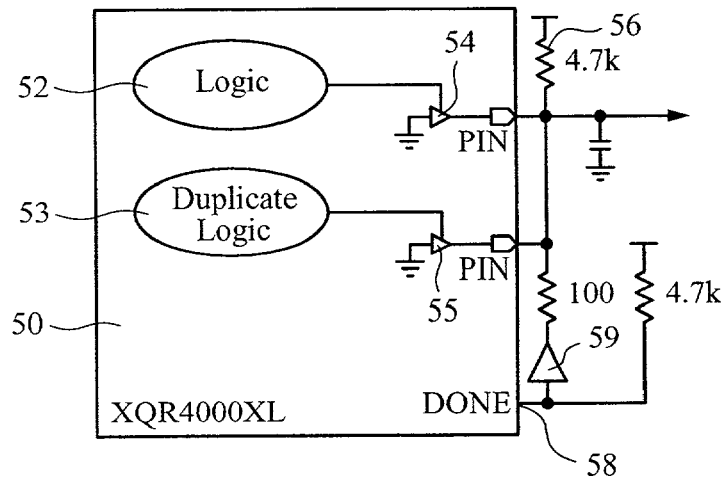
FIG. 7 is a block diagram illustrating a preferred technique of the present invention involving wire-ANDing critical outputs to avoid sending erroneous output signals.

The preferred technique of wire-ANDing is shown in FIG. 7 wherein an FPGA 50 containing redundant logic 52, 53 drives redundant logic paths off-chip. To drive an output High, both the primary and duplicate logic chains 52, 53 must direct their respective output buffers 54, 55 to a high-impedance condition. In this states both logic outputs are high-impedance (looking back into the output pins), and an external pull-up resistor 56 will pull the output High. If the logic chains 52, 53 do not agree, however, one or the other of the output buffers 54 or 55 will be enabled, driving the wire-ANDed buffer output signal Low.

When using the wire-ANDing method, precautions must be taken to assure that the output of an unconfigured part is not interpreted as a true logic High. Because the FPGA's I/Os are in a high-impedance state before and during configuration, some other signal must hold the outputs Low during this time. The FPGA's DONE signal 58 can be conveniently used to do this because it drives Low during configuration. The DONE signal 58 must transition to High after configuration, therefore an open-drain buffer 59 should be placed between it and the outputs that need to be protected. If many outputs are to be controlled in this manner, additional buffers or relays may be added for each output pair.

RAM Redundancy and Refresh

Some space applications require the ability to write data to a RAM for temporary storage purposes. The preferred architecture provides block RAM resources which are large blocks of static memory that are dual port and fully synchronous. Dual port means that both ports to the block RAM have read and write capability. It is always possible that a SEU can upset the data values stored in a RAM in space. A reliable method to combat such an upset is to utilize the dual port memories of the preferred architecture and constantly refresh the block RAM contents. In this method, one of the ports can be dedicated to error detection and correction. But this would limit the use of the block RAMs to be used as single port memories by the rest of the user logic.

Figure 14:
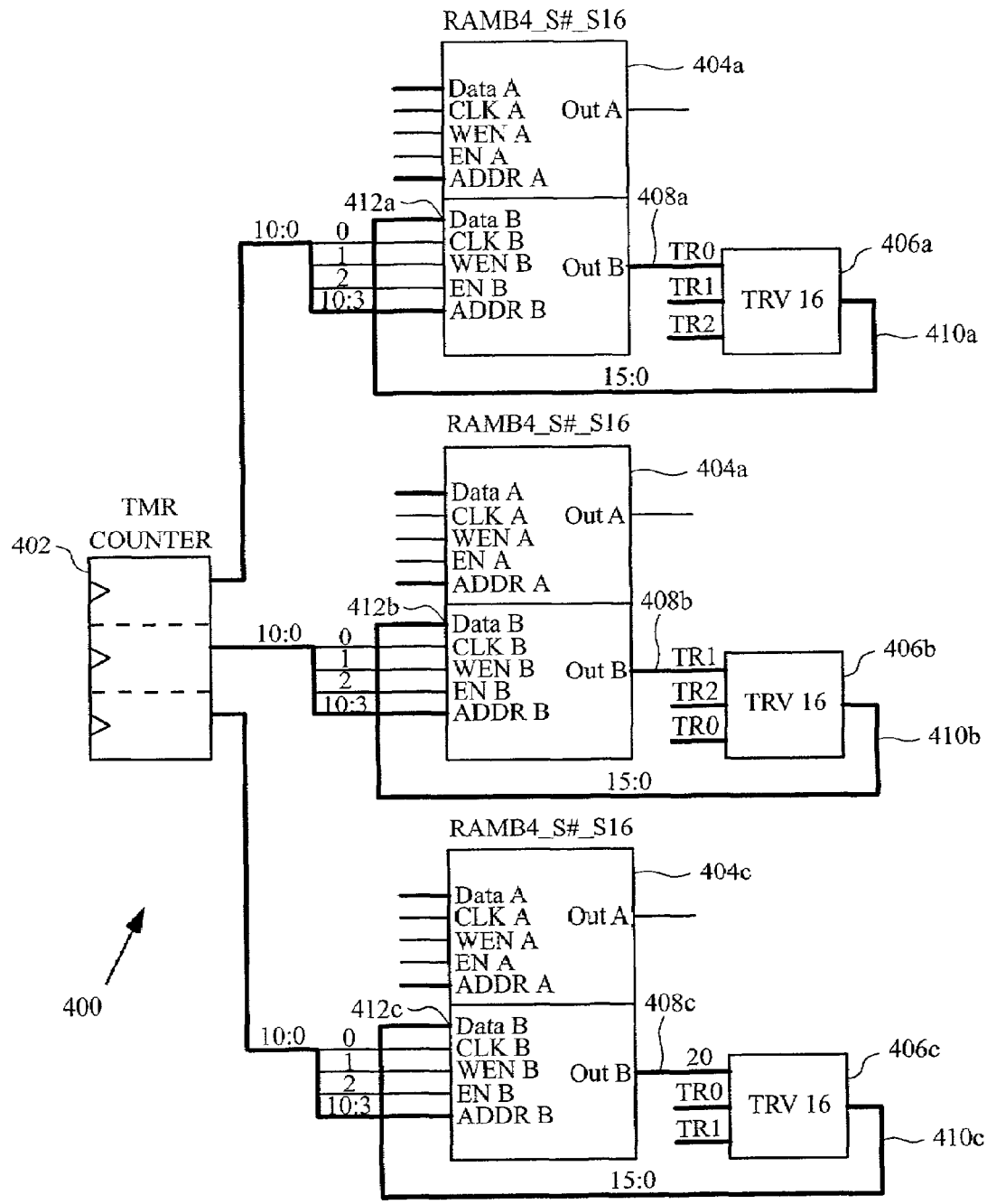
FIG. 14 is a block diagram showing a preferred technique of refreshing dual port RAMs.

Referring now to FIG. 14, a simple circuit for accomplishing a triple redundant RAM with refresh 400 is disclosed. The circuit includes a TMR counter 402, triple redundant block RAMs 404a–404c, and triple redundant voter circuits 406a–406c. In each of the triple redundant block RAMs 404a–404c the B port, denoted by each signal name ending with a B, is dedicated to the refresh function. In each triple redundant block RAM the A port, denoted by each signal name ending in an A, is available for reading and writing from the remainder of the user logic. The output signal bus 408a–408c from the B port of each triple redundant block RAM is connected to the majority voter circuit 406a–406c associated with that block RAM and with the remaining majority voting circuits associated with the two redundant block RAMs. The output 410a–410c of each redundant majority voter is routed back to the input 412a–412c of the B port to the associated block RAM.

In operation, the triple redundant counter 402 sends synchronous clock and address signals to each of the block RAM B ports. Data is read from the B port output into the majority voters, which receive the data from each of the three block RAMs, and which feed the majority result back to each of the block RAMs. In this way any block RAM which experiences a data upset will be refreshed with the correct data from the two redundant block RAMs at the frequency established for the refresh operation.

Detection and Correction in Clock DLLs

Figure 15:
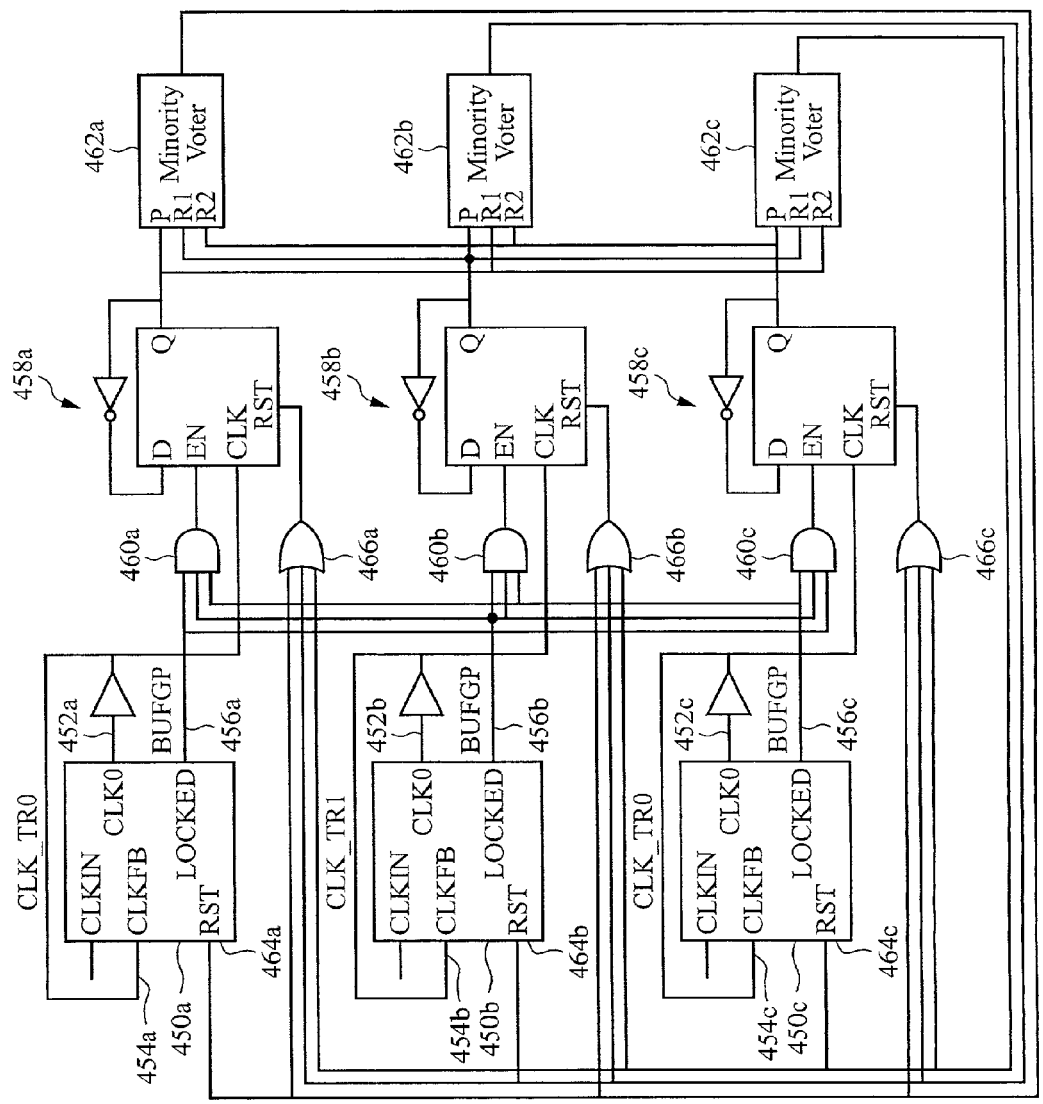
FIG. 15 is a block diagram showing a preferred technique of employing clock delay lock loops.

In some applications users may wish to employ clock delay locked loops to enhance system timing and throughput, as is well known in the art. One method of employing clock DLLs in a TMR application is shown in FIG. 15. FIG. 15 shows three instances of a delay locked loop 450a–450c that are part of the resources provided by the preferred architecture. Each DLL receives a clock input from the same external source. Each DLL 450a–450c produces a clock output 452a–452c which propagates throughout one instance of the users logic design and is also fed back 454a–454c into the DLL. Each DLL also produces a LOCKED signal 456a–456c once the DLL has become synchronized in its domain. A one bit counter 458a–458c is provided for each DLL. A three input AND gate 460a–460c associated with each DLL receives as its inputs the LOCKED signals 456a–456c from each DLL. The outputs of the AND gates 460a–460c are each fed to the enable pin of the associated one bit counter 458a–458c. The clock signal 452a–452c from each DLL is provided as the clock input to each associated one-bit counter 458a–458c. The output of each one-bit counter is fed to an associated minority voter 462a–462c. The minority voters 462a–462c also receive the outputs from the remaining two one bit counters. The output of each minority voter 462a–462c is fed back to its associated DLL reset signal 464a–464c and also to each of three OR gates 466a–466c whose outputs each reset an associated one bit counter 458a–458c.

In operation, once each DLL 450a–450c has reached phase lock and asserts its LOCKED output 456a–456c, the AND gates 460a–460c enable each of the one bit counters 458a–458c. On each clock signal from the DLLs, the one bit counters invert their output. The minority voters 462a–462c determine whether the output from the associated one bit counter 458a–458c is in the minority or not. If the output from the associated one-bit counter is in the minority, then the output of the minority voter is asserted, which causes the associated DLL and each of the one-bit counters to reset. Likewise, the enable input of each of the one-bit counters is deasserted until the DLL which has been reset returns to phase lock and asserts its LOCKED signal 456a–456c, at which time the one-bit counters 458a–458c are enabled again and begin counting.

SEU Detection and Correction Techniques

In the preferred FPGA, the SelectMAP interface provides post-configuration read/write access to the configuration memory array. "Limited readback and comparison" is a post-configuration read and comparison of the configuration memory to detect upsets at the data frame level; "partial reconfiguration" is a post-configuration write to the configuration memory to reconfigure only those data frames identified as containing upsets.

In addition or as an alternative to readback, the FPGA can be made to signal the host system when an upset occurs. This can be done without the use of readback, if desirable, and provides the additional capability of identifying single event functional interrupts (SEFI), or transient upsets, which would not be detected by readback and verification.

A preferred scheme for eliminating readback altogether is to duplicate internal logic and compare similar outputs. When similar outputs differ from each other, then an upset has occurred and a signal is sent to a device which will either select the outputs from redundant devices or initiate detection/correction cycles. This method was discussed above in detail.

Limited Readback and Comparison

The preferred architecture incorporates a readback feature that provides a non-intrusive ability to read the current state of every flip-flop and configuration memory cell within the FPGA. This function in no way affects performance, and the FPGA can run at full speed while simultaneously performing a readback.

During readback, every bit that currently resides in each flip-flop along with every configuration bit is serially shifted out of the readback block. The output of the readback block can drive either an external pin or an internal signal. The amount of time required to perform a readback depends on the size of the FPGA.

There are three different ways to incorporate readback into a design: a microcontroller or microprocessor can be used to verify a checksum; separate FPGAs can be used to monitor each other; or a single FPGA can employ self-readback.

The checksum method involves generating a 16-bit CRC checksum value for each data frame. The checksum is inserted at the end of the readback serial stream. During readback, a new CRC value is generated for each data-frame and compared to the expected CRC result. Since a data-frame is the smallest amount of configuration memory that may be read from or written to the device, it is not important to know which data bit is upset, but merely in which data frame the upset exists. Then, only the affected data-frame need be rewritten to the FPGA to correct the SEU. This method greatly reduces the amount of system resources required to perform SEU detection and correction.

Whenever a data frame produces a CRC value that differs from its corresponding CRC frame constant stored in memory, the frame number should be stored for use after the readback cycle is complete. Although it is very unlikely that more than one frame will contain an SEU within one readback cycle, the CRC mismatch could potentially be produced by an SEU elsewhere in the system and not in the readback data. Therefore, the system should be designed to record multiple frame numbers for the correction cycle. There are two different methods for implementing CRC frame constants. For applications never requiring any update or changes to the FPGAs' design after deployment, the CRC constants for a specific FPGA design can be pre-generated in software and stored in system ROM. For applications that can accept updates for the FPGAs' bitstream, the CRC constants should be generated by the host system in RAM. If the FPGAs' bitstream is ever updated, then the CRC values can be refreshed.

Figure 16:
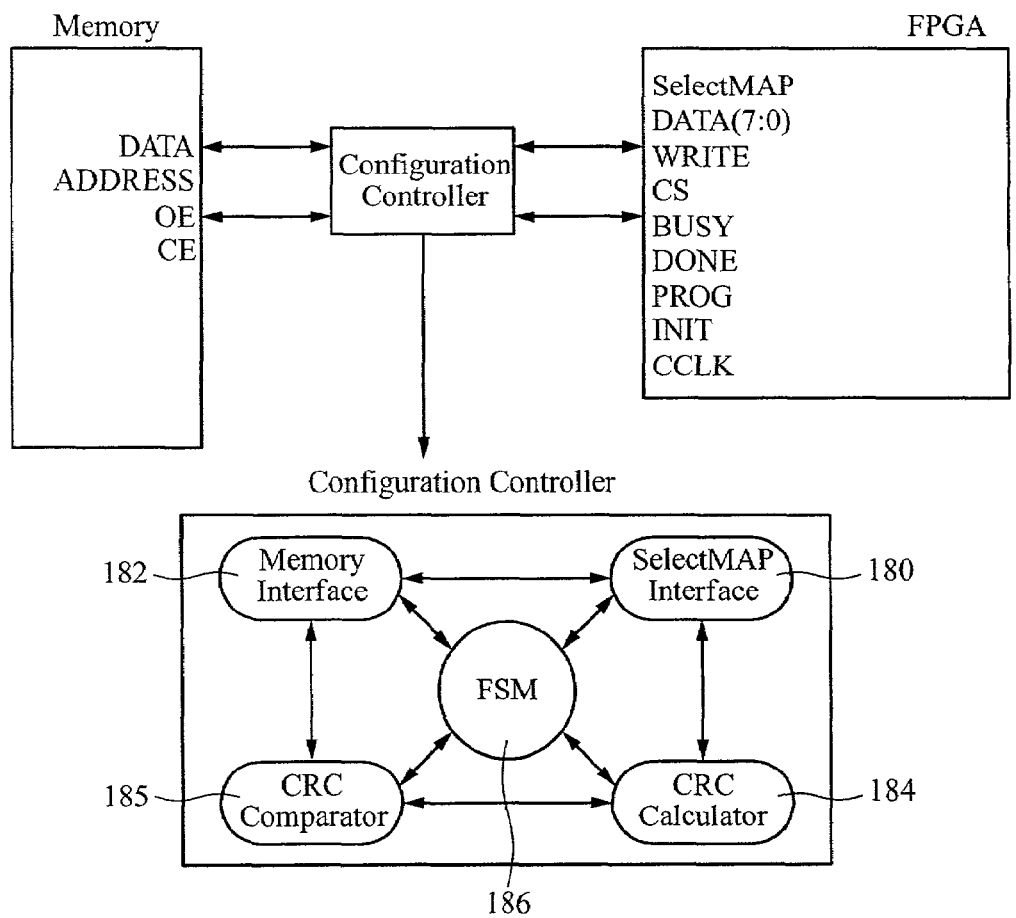
FIG. 16 is a block diagram illustrating a preferred SEU correction technique of the present invention involving partial configuration (single frame correction) of configuration memory.

FIG. 16 shows one possible implementation of this system. The basic sub-blocks represent logic for interfacing with the SelectMAP port 180 and memory components 182 and for calculating and comparing CRC values 184, 185, and a finite state machine to control the operations 186.

The mapping of memory components should be done uniquely for each system. One possible method is to store the CRC values in addresses such that the address number itself corresponds to the Frame number that the CRC value represents. This could reduce the number of processing steps, or decode logic, to access a specific CRC frame constant.

It is important to note that if SelectRAM (configurable blocks of single- or dual-port memory building blocks) is to be used in the design, then a simple CRC check of the readback data will not work. This is because SelectRAM actually employs the configuration bits as storage elements. This means that if the RAM value has been changed, the configuration readback checksum will differ from the default value checksum. Therefore, when incorporating SelectRAM into a design, readback should be used to perform a full bit-for-bit verification of the readback data.

Figure 17:
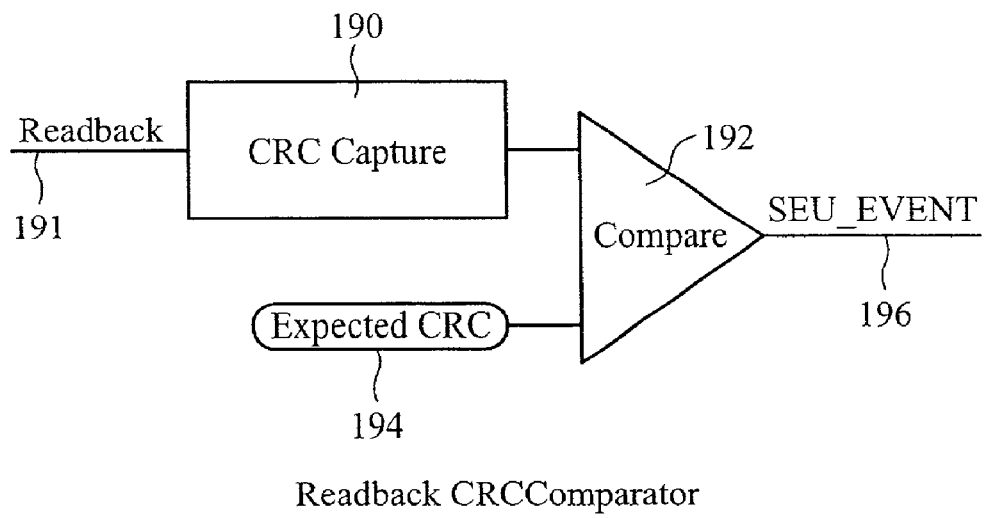
FIG. 17 is a block diagram illustrating a preferred SEU detection technique of the present invention involving limited readback and comparison of configuration data.

FIG. 17 shows a readback CRC compare function which can be implemented using a microcontroller. The microcontroller captures the CRC checksum 190 from the readback serial stream 191 and then compares it 192 to the expected value 194. The output 196 of the circuit can be used to signal an SEU by interrupting the microprocessor. At the next "convenient" time, the FPGA should be commanded to reconfigure.

If a design requires more than one FPGA, or multiple FPGAs are used for redundancy, then each FPGA can be used to monitor the readback serial stream of a neighboring FPGA. The CRC comparator 192 shown in FIG. 18 can easily be implemented in an FPGA. If an SEU is detected, one of two possibilities has occurred—either the FPGA being monitored experienced an SEU or the detection circuit in the monitoring FPGA has itself experienced an SEU. The comparator 192 output signal can be used to alert the system that both FPGAs need to be reconfigured at the next opportunity.

The control logic for performing and capturing the readback requires execution of the following steps. First, to begin the readback, RT must be asserted and held High until readback is complete. Second, the process must be clocked continuously from the beginning to the end of readback. When using a preferred FPGA, the clock signal may be between 1 MHz and 2 MHz. Third, send the input readback data through a 6-bit decoder to watch for the preamble <111110>. Fourth, when the preamble is observed, begin counting the number of clock cycles. Fifth and last, when the count indicates that the CRC is present in the data stream, capture the actual CRC and compare it to the expected CRC.

It is important to note that the CRC of the very first readback should be ignored. Only the CRC from the second and subsequent readbacks should be used because the value of the expected CRC cannot be known prior to execution of a readback.

The readback control logic must be designed to make three consecutive readbacks in order to perform the first compare—the first to initialize, the second to capture the CRC, and the third to execute the compare. Each subsequent readback then results in an immediate compare. However, if the FPGA being read back is reconfigured, this process must start again from the beginning.

Figure 18:
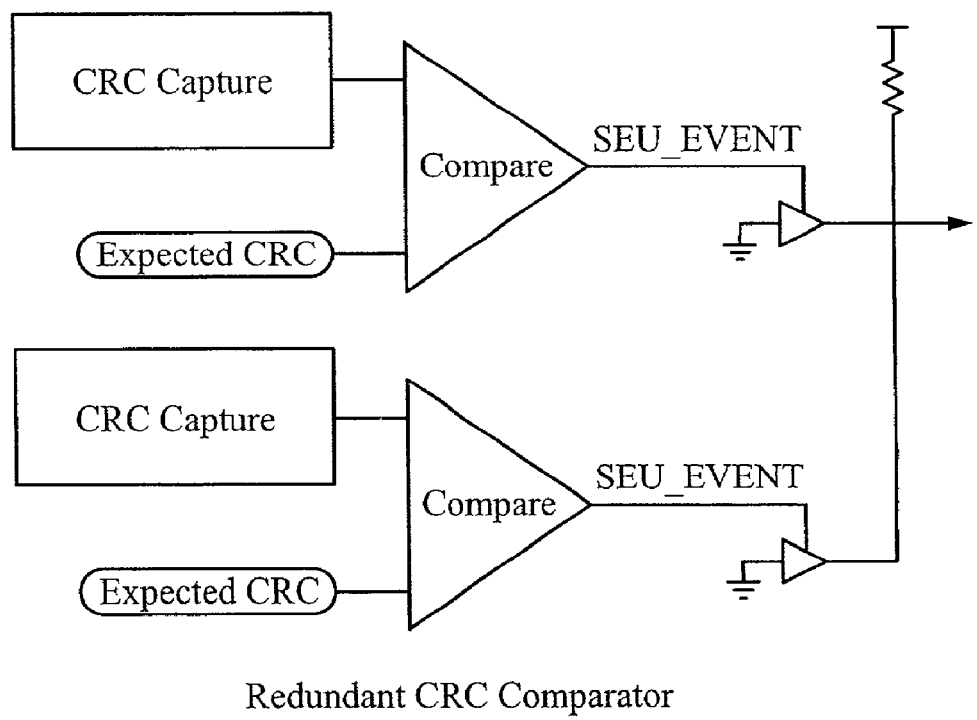
FIG. 18 is a block diagram illustrating a preferred SEU detection technique of the present invention involving redundant limited readback and comparison of configuration data.

The CRC captured from the second readback must be stored for comparison with succeeding readbacks. This can be done with registers, but should use triple module redundancy so that the wrong value is not used if one of the registers is upset. It is acceptable to use LUTs for the voting circuit because, even if they are upset, the system will eventually reconfigure and repair itself.

Where only a single FPGA is used, it is possible to have the FPGA monitor itself. Design redundancy is still required, however, because an SEU can occur in the readback monitor circuit itself. A preferred redundancy method is shown in FIG. 18 and involves creating two readback compare circuits in parallel and wire-ANDing the outputs. Simultaneous occurrence of CRC errors in both comparators would indicate an SEU in the configuration logic under test, rather than in one of the readback compare circuits.

SEU detection and correction using limited read back and comparison and complete configuration is always completed within 40 ms when implemented by a preferred FPGA. Thus, in a low earth orbit, there should typically be 90,000 detection/correction cycles (or 180,000 detection cycles, assuming no other upsets) between statistically expected upsets, meaning that the device is reliably operating without upsets or interrupts 99.9989% of the time.

Partial Configuration (Single Frame Correction)

The time required for SEU correction may be dramatically decreased by the use of partial configuration. The above calculations assumed correction by complete re-configuration requiring 20 ms. Generally, complete re-configuration implies "de-configuration", which means bringing the part "off-line" during the correction cycle and thus losing all internally stored data. In the present invention, partial configuration allows individual frames to be written to the configuration memory. Therefore, only the frame that contains the SEU-affected cell need be corrected.

Assuming that only a single data frame needed to be loaded, the correction time falls to 3 ms. Aside from the efficiency and speed of SEU correction with partial configuration, a far more important advantage is the fact that the device may be left completely active during the correction cycle.

When an upset is detected in the configuration memory, only the data frame that contains the affected bit need be reconfigured. Writing only a single data frame, and only after an upset has occurred, means that the configuration logic will be in "write mode" for the shortest amount of time, and in "read mode" most of the time. This decreases the probability of an upset to the configuration logic itself having any adverse effects to the configuration memory array. However, this technique also requires some system overhead and support for the readback and detection of SEUs in the configuration memory, including hardware implementation of algorithms for reading and evaluating each data frame. Additionally, memory space must be allocated to store constants and variables.

The configuration memory array is divided into three separate segments: The "CLB Frames", Block RAM Frames ("BRAM Frames"), and "BRAM1 Frames." The two BRAM segments contain only the RAM content cells for the Block RAM elements. The BRAM segments are addressed separately from the CLB Array. Therefore, accessing the Block RAM content data requires a separate read or write operation. Read/Write operations to the BRAM segments should be avoided during post-configuration operations, as this may disrupt user operation.

The CLB Frames contain all of the configuration data for all programmable elements within the FPGA, including all Lookup Table (LUT) values, CLB, IOB, and BRAM control elements, and all interconnect control. Therefore, every programmable element within the FPGA can be addressed with a single read or write operation. All of these configuration latches can be accessed without any disruption to the functioning user design.

While CLB flip-flops do have programmable features that are selected by configuration latches, the flip-flop registers themselves are separate from configuration latches and cannot be accessed through configuration. Therefore, partial configuration will not affect the data stored in these registers.

When a LUT is used, however, as either a distributed RAM element or as a shift register function, the sixteen configuration latches that normally only contain the static LUT values become dynamic design elements in the user design. Therefore, the use of partial reconfiguration on a design that contains either LUT-RAM or LUT-Shift-register components may have a disruptive effect on the user operation. For this reason, the use of these components cannot be supported for this technique.

Block RAMs (BRAMs) may be used, however. Because all of the programmable control elements for the Block RAM are contained within the CLB Frames and the Block RAM content is in separate frame segments, partial reconfiguration may be used without disrupting user operation of the Block RAM as design elements.

The configuration memory segments are further divided into columns of data frames. A data frame is the smallest portion of configuration data which may be read from, or written to, the configuration memory. The CLB array of a preferred FPGA may contain four categories of frame columns: one center column (eight frames), CLB columns (48 frames/column), two BRAM-Interconnect columns (27 frames/column), and two IOB columns (54 frames/column). The number of CLB columns and the size of the frames vary with the particular device. However, the frame sizes are constant for a particular device regardless of the column type in which it resides. The entire array may be addressed as one block, or, alternatively, any individual frame may be accessed as a unique block of data.

To write a series of data frames, the Frame Address Register (FAR) must first be set to the address of the first frame in the series. The Frame Data Register In (FDRI) is a frame length register used to write a data frame into configuration memory. After the FAR is set to the desired address, then the number of data-words to be written to the FDRI register must be specified followed by the data. A data-word is a 32-bit word. The number of words to be written is the number of frames to be written times the number of words per frame plus one dummy word (typically all zeros) to follow each frame plus one more frame of dummy words which also must be followed by a dummy word. If writing multiple frames, the first frame will be written to the address specified in the FAR and will automatically increment the address by one frame for each frame of data thereafter.

For each write operation, the number of frame data-words must also include a dummy word in order to complete the write operation. Data written to the FDRI register is assembled into 32-bit words and then loaded into a Frame register equal in size to one data frame. When the frame register is full, the entire frame is loaded in parallel into the configuration memory latches. The last 32-bit word written is always stuck in the FDRI register. This means that a dummy word is needed to push the last word of the last frame of real data into the frame register in order for the entire last frame to be loaded into configuration memory.

A frame address is expressed as a "major address" and a "minor address". The major address is the column number and the minor address is the frame number within that column. The value written to the FAR register contains a Block Type field, the major address, and the minor address. The Block Type should always be "00" to indicate the CLB Frames Segment. The major address is positioned in bits 17 through 24. The minor address is positioned in bits 9 through 16. All other bits should be "0". Therefore, to read or write the first frame of the first column, the value written to the FAR would be all zeros (00000000h).

If the readback cycle produced CRC mismatches then the data for the stored frame numbers must be accessed from memory and reloaded into the FPGA.

Figures 19, 20:
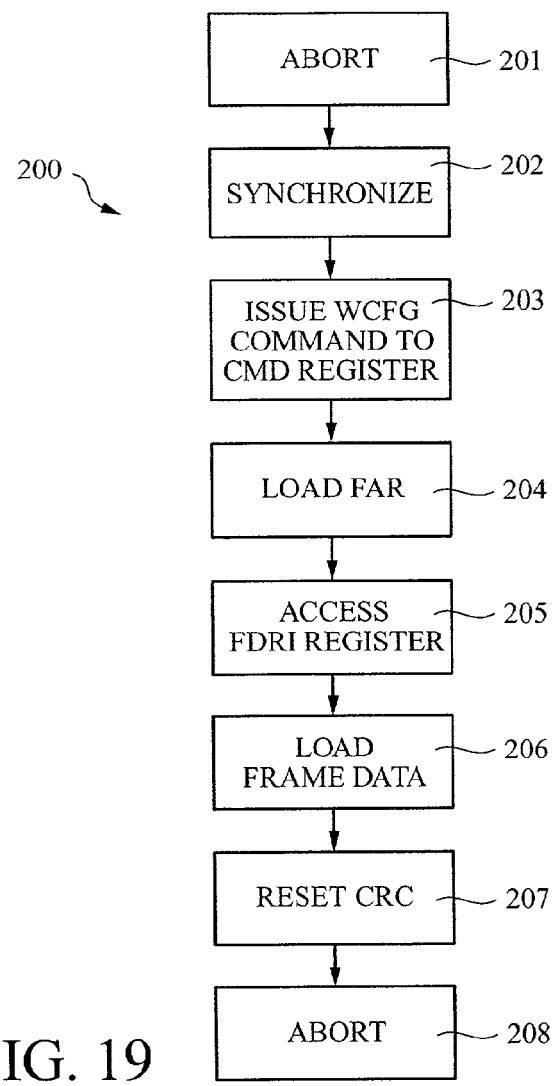
FIG. 19 is a flowchart illustrating the steps in a preferred SEU correction technique of the present invention involving partial configuration (single frame correction) of configuration memory.
FIG. 20 is a table setting forth the instruction set for a preferred SEU correction technique of the present invention involving partial configuration (single frame correction) of configuration memory.

FIG. 19 shows the steps for a single frame write cycle 200.

Step 201 is to issue an abort command by holding the CS Low and the WR High for at least three clock cycles. This will reset the primary access port and configuration logic so that the interface may be re-synchronized. This alleviates tracking the number of clock cycles between readback and write cycles and clears any errors caused by an SEU in the configuration logic itself.

Step 202 requires that before a new process can commence the primary access port interface must be resynchronized by reloading the Synchronization Word.

Step 203 is to enable write access to the configuration memory array by loading the WCFG command into the CMD register.

Step 204 is to specify the frame address in the FAR with a major and minor address location.

Step 205 is to issue a write command to the FDRI register specifying the frame data length in 32-bit words plus one 32-bit dummy word.

Step 206 is to load the data frame into the FPGA followed by one dummy frame. Each frame must be followed by a dummy word. Typically, the bitstream includes these dummy words at the end of each data frame.

Step 207 is to issue a RCRC command to the CMD register to clear the CRC register.

Step 208 is to issue a second abort command, thereby resetting the SelectMAP interface and causing a subsequent resynchronization for any new process, which increases the likelihood that the process will be successful.

FIG. 20 shows the instruction set, except the frame data, for implementing the above described single frame write operation on three different XQVR-series FPGAs. The abort command does not have any associated data.

The simplest method for determining the frame address for the frame which needs to be reloaded is to count the frames during readback, starting with zero but not counting the dummy frame, and then calculate the address based on that frame number. The algorithm for calculating the frame address from the frame number needs to be conditional on which column type the frame comes from because different column types have a different number of frames and because of their organization.

The following variables are used in subsequent discussion:

N=Frame Number;
Cols=The number of CLB columns in the device;
Maj=Major Address portion of the FAR;
Min=Minor Address portion of the FAR;
DIV=Integer Division operation; and
MOD=Modulus remainder operation.

The following algorithm is used to determine the Major and Minor Frame Address from a specific frame number. These conditions and equations would be greatly simplified if they were rewritten for a single device size, removing the number of columns as a variable. All variables are represented as decimal values and subsequently will need to be converted to hexadecimal before obtaining the actual FAR code.

Begin
IF (0<N<7) Then {Frame is in Center Column}
Maj=0;
Min=N;
ElsIF (8<N<[Cols×48+7]) Then {Frame is in CLB Columns}
Maj=(N−8)DIV(48)+1;
Min=(N−8)MOD(48);
ElsIF ([Cols×48+8]<N<[Cols×48+115]) Then {Frame is in IOB Columns}
Maj=(N−Cols×48−8)DIV(54)+Cols+1;
Min=(N−Cols×48−8)MOD(54);
ElsIF ([Cols×48+116]<N<[Cols×48+169]) Then {Frame is in BRAM Interconnect}
Maj=(N−Cols×48−116)DIV(27)+Cols+3;
Min=(N−Cols×48−116)MOD(27);
End IF;
End;

In a Xilinx XQVR300 FPGA, for example, if the frame that needs to be corrected is the 2373$^{rd}$ valid data frame that was read back (not counting the dummy frame), then, counting from zero, the frame number is N=2372. In this particular device, Col=48,
Cols×48=48×48=2304 and
N−2304=2372−2304=68.
N satisfies the third condition: 2312<N<2419. Therefore, $$Maj=(N-Cols\times48-8)DIV(54)+Cols+1=(60)DIV(54)+49=50; \text{ and}$$

$$Min=(N-Cols\times48-8)MOD(54)=(60)MOD(54)=6.$$

Converting these to 8-bit binary values gives the following major and minor addresses: Major: 00110010; Minor: 00000110. Inserting the Major Address into bits 17 through 24, the Minor Address into bits 9 through 16, and placing zeros in all other positions gives an FAR value of: FAR(31:0)=0000 0000 0110 0100 0000 1100 0000 0000b=00 64 0c 00h.

Dual Chip Readback in the Alternative Architecture

Referring again to the alternative architecture implementation of FIG. 13, it is possible to have the FPGAs 86, 87 of the system perform a constant readback on each other's configuration memory to detect for SEUs. RB_OUT 136, 137 and RB_IN 138, 139 are arbitrary bus names for the readback interface and the direction of data flow between the devices 86, 87. The RB_OUT 136, 137 ports provide external access to the READBACK primitive and each comprises three separate pins (two inputs and one output). The two inputs are the readback trigger (RT) and the readback clock (CLK). These must be connected to the RT and CLK pins of the READBACK primitive. The output signal is for the readback data which comes from the RD pin of the READBACK primitive.

The RB_IN ports 138, 139 interface directly with the RB_OUT 136, 137 of the other FPGA 86, 87, and therefore comprise the same pins though data directions are reversed (the clock and trigger are outputs and data is input). As with partial configuration described above, a CRC check is the preferred method of performing the readback verification for the same reasons. Specifically, a CRC check is easier, requires less logic to implement, and does not require external memory devices to implement as does a bit-by-bit readback.

When one FPGA 86 or 87 detects that the other has been upset, it will force the upset FPGA 86 or 87 to reconfigure. When the upset FPGA 86 or 87 is reinitialized and resumes operation, it should notice that the other FPGA 86 or 87 is already running, and should assert a soft reset (GSR) to both FPGAs 86, 87 to resynchronize the system 84. The soft reset causes an unfortunate disruption of the system 84, but the interruption is less severe than it would be with less sophisticated SEU mitigation. The system will still function while an upset FPGA 86 or 87 is being reconfigured.

The falling edge detector 98 or 99 in the active FPGA 86 or 87 generates a pulse when the other FPGA 86 or 87 comes back online following reconfiguration. This pulse should be used to assert a global reset in the logic of both FPGAs 86, 87. This will resynchronize all the logic of both FPGAs 86, 87 after one FPGA has been reconfigured or has been momentarily off-line due to a transient interrupt. This is important, as it protects the hard-wired OUTPUTS from being in a state of contention.

Scrubbing

"Scrubbing" is an SEU correction technique that omits readback and detection of SEUs and simply reloads the entire CLB Frame segment at a chosen interval. Scrubbing requires substantially less overhead in the system, but does mean that the configuration logic is likely to be in "write mode" for a greater percentage of time. However, the cycle time for a complete scrub can be made relatively short depending on the throughput speed of the SelectMAP interface (approximately 400 Mbits/s in a preferred FPGA type).

The chosen interval for scrub cycles should be based on the expected static upset rate for a given application or mission, which may be fairly infrequent. A longer cycle interval (time between scrubs) and shorter cycle time (scrub time) decreases the total percentage of time that the configuration logic is in "write mode."

Scrubbing does not require any readback or data verification operations, nor does it require any data generation when reloading the data frames. In short, the process is to reload the bit-stream starting at the beginning, but stopping at the end of the first write to the FDRI register. In a standard bit-stream the first write to the FDRI register includes all the configuration data for the CLB Frames segment of the memory map. The rest of the bit-stream contains the BRAM segments, a CRC check, and the start-up sequence, all of which are not applicable to partial reconfiguration. No adjustments to the data or headers are needed.

A scrub cycle should be preceded and followed by an Abort operation. However, the Abort operation preceding the scrub cycles may be omitted if one Abort cycle is inserted after the completion of the initial configuration of the FPGA. The bitstream already contains the synchronization word at the beginning. The only support circuitry necessary is a counter to generate memory addresses (if necessary), and decode logic to toggle the control signals of the memory and SelectMAP interface at specific count values. This is the mechanism that controls how much of the bitstream is loaded.

If the FPGA is to be configured from a Serial PROM, then adding a serial-parallel converter to the interface would allow the serial prom to act as the data source for both configuration and scrubbing.

Figures 21, 22:
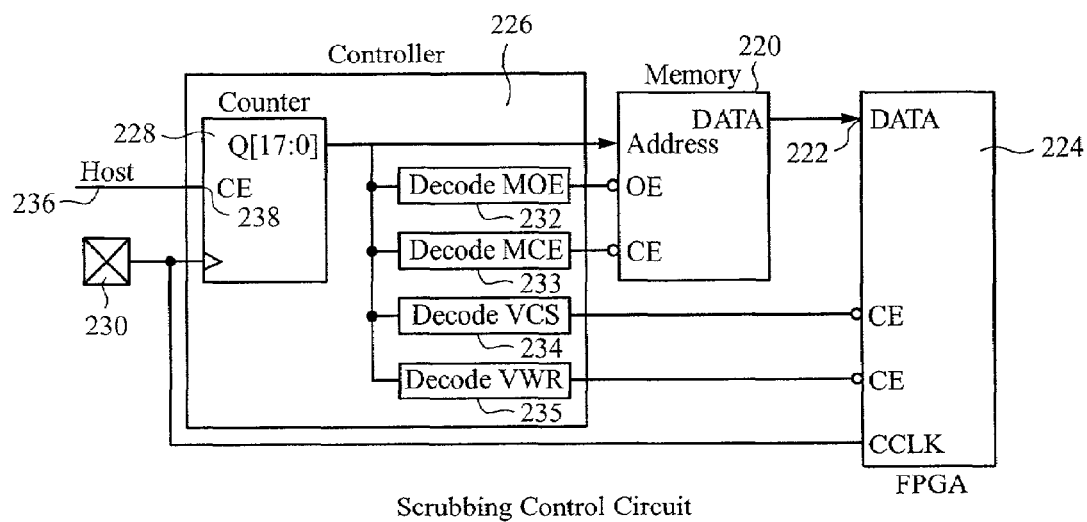
FIG. 21 is a block diagram illustrating a preferred SEU correction technique of the present invention involving anticipatory reconfiguration, or "scrubbing", of configuration memory.
FIG. 22 is a table setting forth the state transitions associated with a preferred SEU correction technique of the present invention involving anticipatory reconfiguration, or "scrubbing", of configuration memory.

Randomly accessed memory is not required because scrubbing reloads the majority of the bitstream from the beginning. Instead, as shown in FIG. 21, a parallel (8-bit wide) memory device 220 may be used, which allows the data signals to be connected directly from the memory 220 to the SelectMAP data pins 222 of the FPGA 224. If the memory's data ports are of any other configuration, then the data should be reorganized into 8-bit words within the control chip 226.

A simple counter 228 is a sufficient state machine to control the scrubbing operations. The LSB outputs of the counter 228 (number depends on the size of the memory) may be used as the address for the memory module 220. Required counter size depends on the type of FPGA 224 used.

If the system clock 230 is too fast for the configuration interface, the address lines can be shifted to higher order bits of the count value, leaving the lower order bits to serve as a clock divider.

There are four signals that need to be decoded from the counter 228: MOE (Memory Output Enable) 232, MCE (Memory Chip Enable) 233, VCS (Chip Select) 234, and VWR (Write) 235. The number and complexity of the necessary decoders and their associated values depends on how many memory chips 220 and FPGAs 224 are being designed into the system, which is an entirely application specific variable.

If the system has several memory chips 220, each memory 220 requires its own decoded MCE signal 233. For one memory chip 220, however, the MCE 233 may be eliminated altogether and tied to the decoded MOE signal 232. The MOE 232 must disable the memory's output during an Abort sequence. However, the VCS 234 and VWR 235 may not be combined, even for a single FPGA implementation, because the Abort sequence requires separate control of these signals.

FIG. 22 shows the state transitions for a complete example scrubbing operation performed on three different XQVR-series FPGAs, including a trailing Abort sequence, and the associated clock cycles for each state. One clock cycle represents one byte of data transferred. If the counter 228 is to be used as a Configuration Clock (CCLK) divider as well, then the number of clock transitions would need to be multiplied by the divisor.

The system also needs some sort of mechanism to control how often a scrub cycle takes place. In FIG. 19 this is shown simply as a connection 236 from the Host System to the CE input 238 of the counter 228. Also, a reset control is needed for the counter 228. If the desired time between scrub cycles is constant, then this could be automated by using another counter to control the CE 238 of the scrub counter 228 and another decoder to control a synchronous reset of the counters. Choosing how long to wait between scrub cycles (Scrub Rate) should be determined primarily from the expected upset rate for the specific application, orbit, or mission.

A Scrub Rate describes how often a scrub cycle should occur. It may be denoted by either a unit of time between scrubs, or a percentage (scrub cycle time divided by the time between scrubs). The scrub rate should be determined by the expected upset rate of the device for the given application.

Generally, upset rates are calculated from the Static Bit Cross Section (typically available from the device's data sheet) of the device and the charged particle flux the application or mission is expected to endure. For other technologies, the upset rate is an indication of how often the system will have to tolerate a functional bit error.

This is not precisely the case for an FPGA, however. The static cross-section for a given device is derived by determining the cross-section per bit multiplied by the number of bits in the device. The static cross-section for the preferred FPGA architecture may be orders of magnitude higher than what the experienced space applications designer might be used to. This is due to the high density of configuration latches. But this upset rate does not carry the same meaning as it does for other technologies.

For example, comparing a 6,000 flip-flop ASIC to a 6,000 flip-flop Virtex-series FPGA, if the ASIC and the FPGA have similar process geometries then the static cross-section per bit will be similar for both devices. However, the device cross-section is the bit cross-section multiplied by the number of bits in the device. For a 6,000 flip-flop ASIC the number of bits is 6,000, but for a Virtex-series FPGA this number is 6,000 plus 1.7 Million (approximately).

For an ASIC, a bit upset is considered to be a definite functional bit error. This would be an incorrect assumption for an FPGA. An upset in the configuration memory may or may not have any effect on the functional integrity of the user's design in the FPGA. Design techniques may be applied to strengthen the functional integrity of the user design and protect it from the effect of any SEU.

Where systems that include ASIC technology use a static upset rate to determine how often a functional bit failure may be expected, systems that use the preferred FPGA architecture should define a "Dynamic Upset Rate" for this purpose.

The necessary assumption, however, is that the scrub rate should be set such that any SEU on the configuration memory will be fixed before the next SEU will occur. Additionally, the lifespan of an SEU, time between the occurrence of the upset and it's subsequent correction, should be minimized. Scrub rates are entirely a matter of design choice. A good "rule of thumb" is to place the scrub rate at one order of magnitude faster than the upset rate. In other words, the system should scrub, on average, ten times between upsets. Meanwhile, the FPGA will be capable of carrying out it's operations and functioning normally.

From the preceding description, it can be seen that the mitigation, detection, and correction techniques of the present invention make the SRAM FPGA as SEU-immune as any technology currently used in orbit while at the same time offering performance, features, and capabilities that were never before available. More particularly, the present invention introduces techniques that reliably mitigate, detect, and correct upsets in the SRAM cells (the configuration memory) without disrupting device and user functions and makes efficient use of any CLB resources used.

Although the invention has been described with reference to a preferred architecture and an alternative architecture illustrated in the attached drawings, it is noted that equivalents may be employed and substitutions made herein without departing from the scope of the invention as recited in the claims. Furthermore, while described in terms of a preferred SRAM FPGA architecture, the present invention is for SEU mitigation techniques and error detection-correction techniques which are independent of any particular brand of SRAM FPGA, and those of ordinary skill will understand they can be adapted to a variety of SRAM FPGA architectures.

Having thus described the preferred embodiment of the invention, what is claimed as new and desired to be protected by Letters Patent includes the following:

1. A method of maintaining configuration data in a configurable device, the method comprising the steps of:
   (a) performing a first readback of a portion of the configuration data and generating a first checksum value indicative thereof;
   (b) performing a second readback of the same portion of the configuration data and generating a second checksum value indicative thereof; and
   (c) comparing the first checksum value with the second checksum value and, if they are not identical, indicating that remedial action should be taken.

2. The method as set forth in claim 1, the method further comprising the step of initiating a reconfiguration of the configurable device when remedial action is indicated.

3. The method as set forth in claim 1, the comparison being performed by a microcontroller.

4. The method as set forth in claim 1, the comparison being performed by a second configurable device, the first and second configurable devices being initially configured with identical configuration data.

5. A method of maintaining correct configuration data in a configurable device, the method comprising the steps of:
   (a) performing a readback of a portion of the configuration data and generating a checksum value indicative thereof;
   (b) comparing the first checksum value with a predetermined master checksum value, the master checksum value being known to be correct; and
   (c) indicating, if the comparison reveals that the checksum values are not identical, that remedial action should be taken.

6. The method as set forth in claim 5, the method further comprising the step of initiating a reconfiguration of the configurable device when remedial action is indicated.

7. The method as set forth in claim 5, the comparison being performed by a microcontroller.

8. A method of correcting an error in configuration data in a configurable device, the error being confined to a portion of the configuration data, the method comprising the steps of:
   (a) identifying the portion of the configurable data containing the error; and
   (b) reconfiguring only the portion of the configuration data containing the error.

9. The method as set forth in claim 8, the portion of the configuration data containing the error being a single data frame.

10. The method as set forth in claim 8, step (a) being accomplished using limited readback and comparison with a checksum value.

11. A method of correcting an expected error in configuration data in a configurable device, the configuration data being subject to periodic errors, the method comprising the steps of:
    (a) determining the upset frequency with which an error is likely to occur; and
    (b) reconfiguring the configuration data with a scrub frequency based upon the determined error frequency and without determining whether an error has actually occurred.

12. The method as set forth in claim 11, the configuration data being exposed to radiation likely to cause the expected error, the error frequency being determined based upon length of exposure of the configuration data to the radiation and the expected strength of the radiation.

13. The method as set forth in claim 11, the scrub frequency being one order of magnitude greater than the error frequency.

* * * * *